United States Patent [19]

Grodevant

[11] Patent Number: 5,666,045

[45] Date of Patent: Sep. 9, 1997

[54] LASER DRIVE AND CONTROL SYSTEMS USEFUL FOR LASER DIODE PROTECTION

[75] Inventor: Scott R. Grodevant, Hilton, N.Y.

[73] Assignee: PSC Inc., Webster, N.Y.

[21] Appl. No.: 353,421

[22] Filed: Dec. 9, 1994

[51] Int. Cl.$^6$ .................. G05F 1/40; H01S 3/00
[52] U.S. Cl. ........................... 323/282; 372/38
[58] Field of Search ................ 323/282, 276; 361/87, 90, 91; 372/26, 29, 31, 34, 38

[56] References Cited

U.S. PATENT DOCUMENTS

| | | | |
|---|---|---|---|
| H322 | 8/1987 | Simmons | 372/29 |
| 3,692,591 | 9/1972 | Popka | 307/264 |
| 3,944,908 | 3/1976 | Oki | 321/15 |
| 4,302,804 | 11/1981 | Bader | 363/60 |
| 4,481,566 | 11/1984 | Hoffman et al. | 363/60 |
| 4,488,305 | 12/1984 | Claverie et al. | 372/38 |
| 4,733,159 | 3/1988 | Edwards et al. | 323/282 |
| 4,796,174 | 1/1989 | Nadd | 363/60 |
| 4,924,473 | 5/1990 | Burgyan et al. | 372/38 |
| 4,926,354 | 5/1990 | Pattantyus | 363/98 |
| 5,006,974 | 4/1991 | Kazerounian et al. | 363/60 |
| 5,111,375 | 5/1992 | Marshall | 363/60 |
| 5,128,560 | 7/1992 | Chern et al. | 307/475 |
| 5,140,603 | 8/1992 | Anderson, Jr. et al. | 372/38 |
| 5,200,597 | 4/1993 | Eastman et al. | 235/455 |
| 5,237,261 | 8/1993 | Hoapakoski | 323/282 |
| 5,276,697 | 1/1994 | Davis | 372/38 |

*Primary Examiner*—Edward Tso
*Assistant Examiner*—Adolf Berhane
*Attorney, Agent, or Firm*—Joseph F. Murphy

[57] ABSTRACT

A laser drive and control system which provides protection for a laser diode by preventing excess current from a power source, that normally supplies power to the laser diode, from destroying the laser diode when the voltage supplied by the power source to the laser diode decreases below a certain voltage which causes excess current. The system is implemented in CMOS circuitry for miniaturization into an integrated circuit chip.

20 Claims, 15 Drawing Sheets

FIG. 2
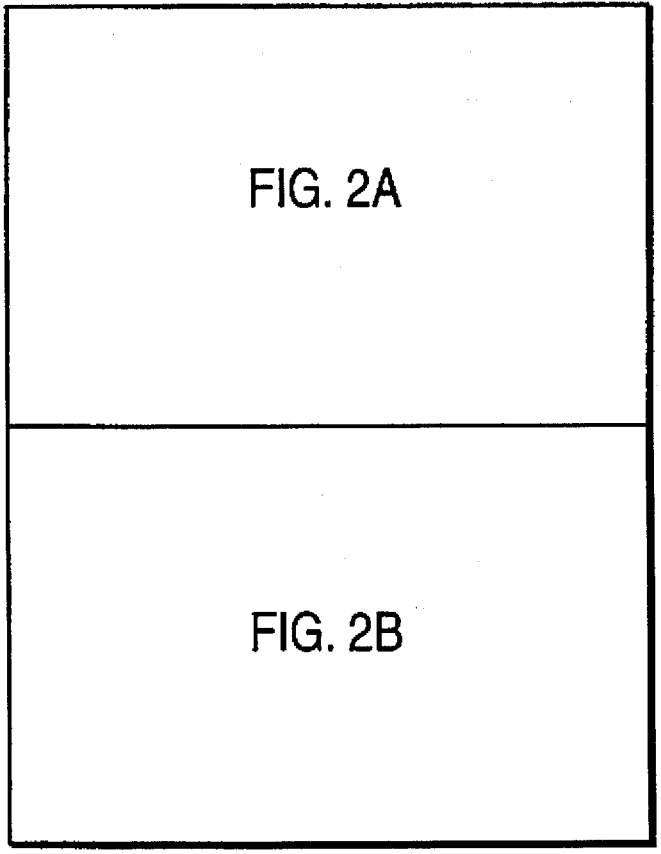
FIG. 2A
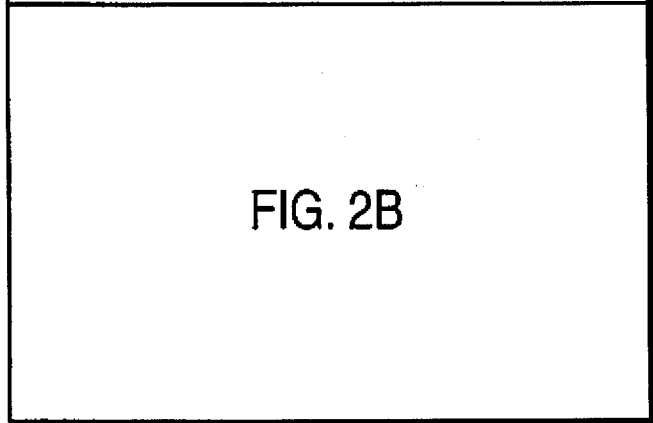
FIG. 2B (X1-X4 ARE INVERSE OF THEIR RESPECTIVE GATE SIGNALS)

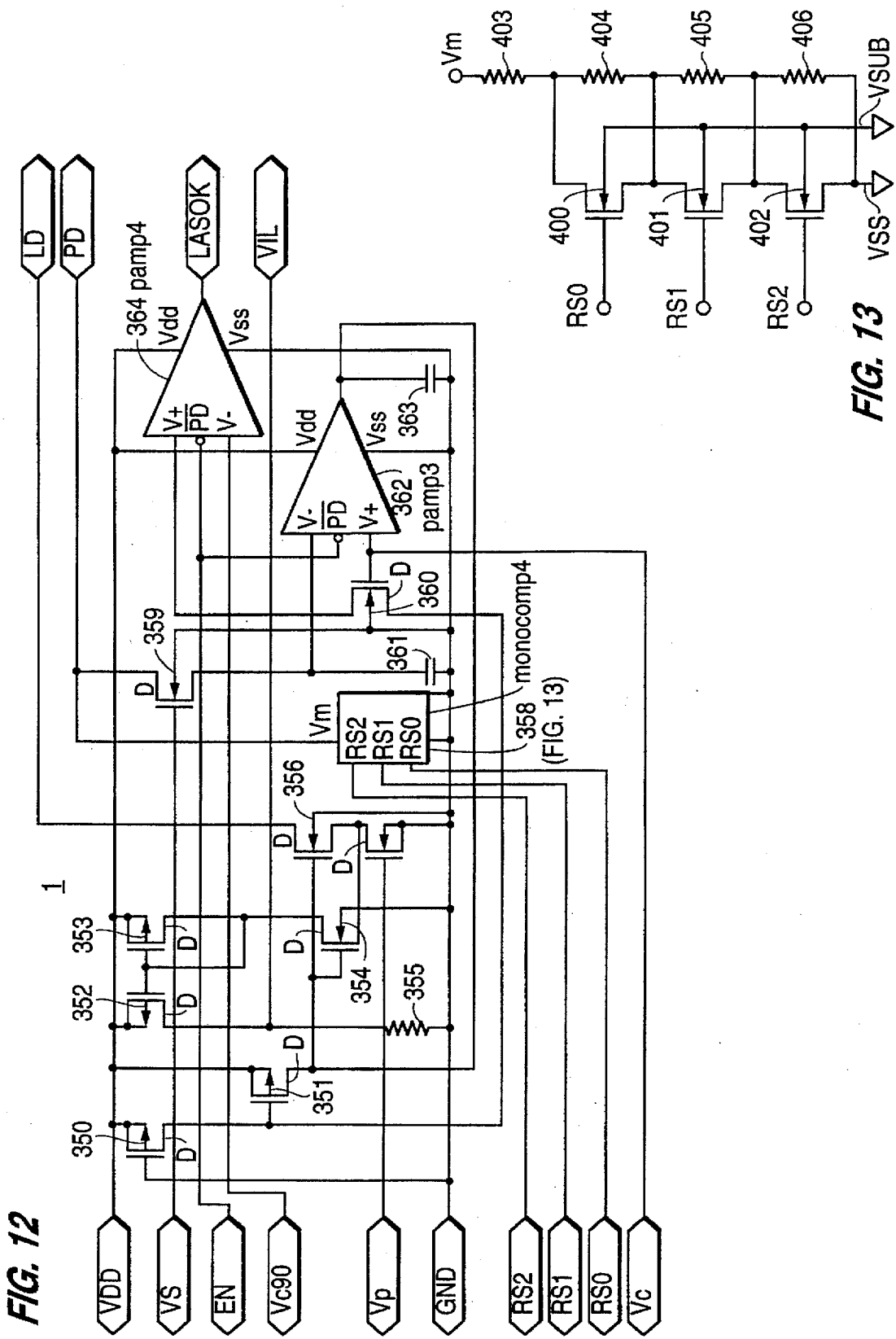

LASER DRIVE AND CONTROL SYSTEMS USEFUL FOR LASER DIODE PROTECTION

FIELD OF THE INVENTION

The invention relates generally to laser systems, and particularly to systems for driving a laser diode and protection of the diode from damage due to excess drive current. The invention is especially suitable for drive and control of laser diodes which provide a source for an optical scanning beam in an optical symbol (bar code) scanner.

BACKGROUND OF THE INVENTION

Bar codes have been used in a wide variety of applications as a source for information. Typically bar codes are scanned at a point-of-sale terminal in merchandising for pricing and inventory control. Bar codes are also used in controlled personnel access systems, and in manufacturing for work-in process and inventory control systems, etc. The bar codes themselves represent alphanumeric characters by series of adjacent stripes (bars and spaces) of different widths and reflectivity, such as in the universal product bar code (UPC) used in retail merchandising.

Bar code reading systems or scanners have been developed to read bar codes. In many such scanners, a laser diode emits a light beam. The light beam is scanned across the bar code and return light from the bar code is collected by the scanner. The intensity of the return light is proportional to the reflectance of the area illuminated by the laser diode. This return light is converted into an electric signal using a photodiode. The signal is then amplified, digitized and decoded.

During normal operation of the scanner there are periods of time in which the scanner is inactive or idle. The laser diode can be turned off during these inactive or idle periods to conserve power and reduce heating which is potentially damaging to the laser diode. Conservation of power increases battery life in portable and hand held scanners and data collection terminals incorporating such scanners, then known as scan engines.

Laser diodes are operated by the electrical current provided by drive and control systems or circuits, which may provide optical power regulation by control of current through the laser diode, see, e.g. Eastman et al, U.S. Pat. No. 5,200,597 issued Apr. 6, 1993 and U.S. Pat. Appl. Ser. No. 08/296,788 filed Aug. 26, 1994 and assigned to the assignee of this application. Typically an optical power regulator monitors the current through a monitor photodiode that is housed in the same package as the laser, in such a manner as to be illuminated with a portion of the laser's emitted light. The monitor photodiode current is compared with a predetermined value, corresponding to the desired optical power, and the difference between these values is amplified and drives the laser, thus forming a closed-loop control system. Laser diodes require an operating voltage which exceeds a threshold, called the forward voltage drop, in order to conduct current. When the laser diode operating voltage nears the forward voltage drop of the laser diode, momentary power fluctuations can cause the laser diode to stop conducting, because the operating voltage is less than the forward voltage drop. During these low voltage periods, a conventional optical power regulator senses the lack of optical output power because the photodiode current decreases or cuts off. Since the optical power then drops below its desired value, the regulator attempts to increase the optical power by increasing the laser current. However, because the operating voltage is too low to exceed the forward voltage drop of the laser diode, the regulator saturates without effecting an increase in optical power output from the laser. When voltage is later restored, the laser immediately begins conduction and the saturated power regulator causes a current surge through the laser diode that can permanently damage the laser diode. The foregoing problem is exacerbated when the optical power regulator is fabricated with power handling field effect transistors (FETS), made using bulk CMOS (complimentary metal oxide silicon) fabrication techniques and then called MOSFETS, because power FETS tend to introduce forward voltage drops which the operating voltage must exceed in addition to the laser diode forward voltage drops.

SUMMARY OF THE INVENTION

Briefly described, a laser diode drive and control system embodying the present invention incorporates a protection circuit for the laser diode. The protection circuit monitors a power source, that normally supplies operating voltage for the laser diode, and detects when the voltage supplied by the power source is apt to resulting a drive voltage for the laser diode which is less than the laser forward break-down voltage. The circuit then generates an increased drive voltage so that the current for desired output optical power is maintained and kept from exceeding safe levels, thereby preventing damage to or destruction of the laser diode. A charge pump, voltage doubler which is implemented by FETS generates the increased voltage.

BRIEF DESCRIPTION OF THE DRAWINGS

FIG. 2, FIG. 2A and 2B is a schematic diagram showing CHARGE PUMP 10 in FIG. 1A in greater detail;

FIG. 12 is a schematic diagram of the circuit of LASREG 1 of FIG. 1A in greater detail; and FIG. 13 is a schematic diagram showing MONCOMP4 of FIG. 12 in greater detail.

DETAILED DESCRIPTION

Figure 1:
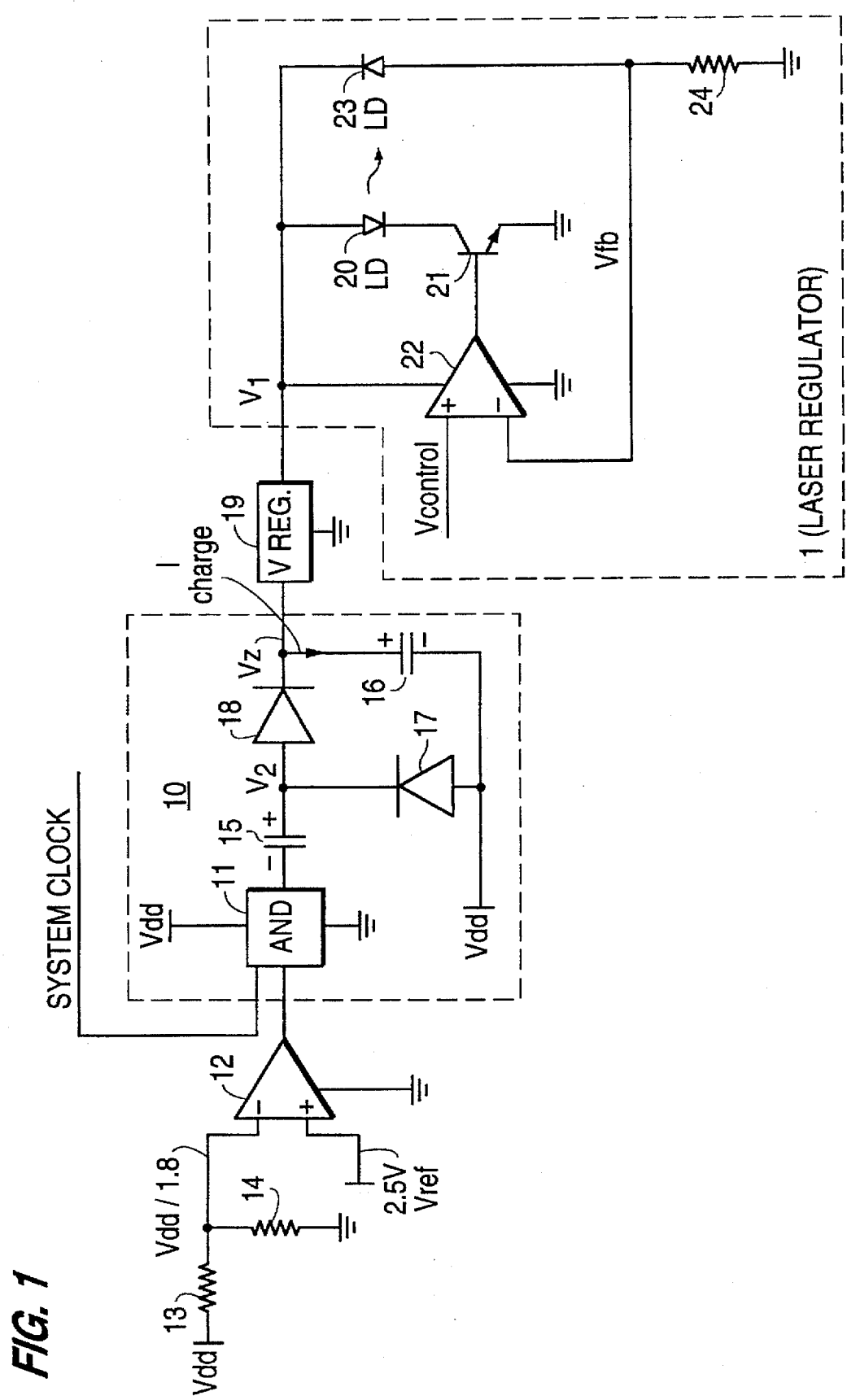
FIG. 1 is a schematic diagram which illustrates the principles of operation of a laser diode driving and control system embodying this invention.

The system shown in the drawings drives and controls, and in so doing, both powers and protects, a laser diode 20 against over current when the operating voltage Vdd drops, as is common when a battery supplies the operating voltage, as in portable, hand held bar code scanners.

Referring more particularly to FIG. 1, AND gate 11, has two inputs, in addition to the supply operating voltage Vdd, (e.g. 4.5 volts) which comes from a battery or another power supply. These inputs are the output of comparator 12X; and the system clock which is a square wave with a nominal 50% duty-cycle. One of the two inputs to comparator 12 is a constant, stable reference voltage lower than Vdd, which in this example is 2.5 volts and the other input to comparator 12 is the output of a voltage divider formed by resistors 13 and 14 connected to ground. This voltage divider divides Vdd by 1.8, so that when Vdd is at its rated 4.5 volts or above, the comparator output is low. The comparator 12, enables or inhibits charge pump 10 depending upon magnitude of the supply voltage Vdd, reference voltage $V_{ref}$ and ratio (A) of resistor 14 to resistor 13, and may be expressed as follows to define a trip or threshold voltage, Vtrip, in terms of these variables:

$$V_{trip}=V_{ref}*(A+1)$$

indicates a multiplication process Vtrip is set to 4.5 volts for this example. When the supply voltage or Vdd is equal to the trip voltage, Vtrip, the inverting input of comparator 12 equals the reference voltage, Vref. When Vdd exceeds Vtrip, comparator 12 output is low, disabling the charge pump. Conversely, when Vdd is below Vtrip (and high enough for AND gate 11 to operate), the charge pump is enabled. In this manner the charge pump is enabled for low supply operation, when it is needed to protect the laser against low voltage conditions, and the charge pump is disabled under normal and high voltage operating conditions when its use could damage a MOSFET circuit implementing the charge pump 10 on an integrated circuit chip, which is the presently preferred implementation of this invention and is described in detail hereinafter.

Vtrip, is the voltage threshold which differentiates low voltage operation from normal and high voltage operation. Vtrip is chosen high enough so that the laser 20 and its associated optical power regulator loop (formed by monitor diode 23, resistor 24, comparator 22 and transistor 21) operate reliably at voltages above Vtrip. Additionally, Vtrip must be low enough to insure that MOSFET channel punch-through (the destruction mechanism of charge pump 10) does not occur at voltages exceeding about two times Vtrip. The load on the charge pump is the regulator 19, the laser diode 20 and its associated circuit elements 21–24.

When charge pump 10 is operating (enabled when the output of comparator 12 is high), it has alternating charge and transfer states that are controlled by the level of the system clock which propagates through AND gate 11. A low level on the output of AND gate 11 activates the charge state, and a high level activates the transfer state. Because the output of comparator 12 is asynchronous with the system clock, the pump can start in either state. The duration of the initial state (when the output of the comparator 12 first goes high upon deletion of $V_{trip}$ is unknown (but less than one-half clock cycle). The initial state and the duration of the initial state, thus, has no impact on the steady-state behavior of the system of FIG. 1.

During the charge state or mode, the output of AND gate 11 is low. A conduction path is then established from Vdd through diode 17 to the positive terminal of capacitor 15, which may be an electrolytic capacitor, and from the negative terminal of capacitor 15 through the output of AND gate 11 to ground. During the charge state, this conduction path allows capacitor 15 to charge to approximately Vdd, minus the forward voltage drop of diode 17.

During the charge state or mode, capacitor 16 supplies current to voltage regulator 19. If capacitor 16 (also preferably an electrolytic) is initially discharged, the voltage at mode V2 will become negative, as capacitor 16 supplies the load during the charge state. Thus the voltage at node Vz drops below Vdd. Should the voltage potential at node Vz fall below the combined forward voltage drops (1.4 volts) of diodes 17 and 18, they will be forward biased and directly supply current to the load from Vdd. Thus the voltage at node Vz is cannot drop below approximately (Vdd −1.4) volts. However, the usual case is that capacitor 16 is positively charged as indicated by the + and − signs at its terminals. Thus node Vz has a higher potential than node V2 and diode 18 is reversed biased and not conducting.

When the output of AND gate 11 switching to a high state the transfer state or mode is initiated. Vdd then is applied to the terminal of capacitor 15 marked with a − sign. The potential of the positive terminal of capacitor can then reach nearly double Vdd. Since the voltage potential of node V2 is now larger than node Vz, diode 18 is forward biased and provides a conduction path for the charge accumulated in capacitor 15, during the prior charge cycle, to flow into capacitor 16. During the transfer cycle both capacitors 15 and 16 supply the load. Once AND gate 11's output returns to the low state, the charge mode is again initiated and the process repeats.

The choice of system clock rate depends upon the capacitance of capacitors 15 and 16, the dynamic resistances of diodes 17, 18 and the output driver circuit of AND gate 11. The clock rate is chosen as fast as possible, but slow enough to give capacitor 16 and diodes 17 and 18 enough time to charge and discharge. Additional system considerations might apply to the selection of the system clock rate namely Governmental FCC in the U.S.A.D radio frequency emission requirements, internal noise bandwidth, etc. For instance, within hand-held bar code scanning equipment, the received light signal temporal spectra is in the 1 to 30 kilohertz (KHz) range, making this frequency range unattractive as a system clock selection due to possible noise interference with the signal conditioning electronics. Thus 100 KHz may be suitable.

Considered together the charge pump 10, provided by AND gate 11, capacitors 15, 16, diodes 17 and 18 acts as voltage doubler 10. The positive terminal of capacitor 16 and the output of diode 18 is connected to voltage regulator 19. Voltage regulator 19 can be any one of a number of conventional solid-state three-terminal voltage regulators. Preferably a commercially available device, of which National Semiconductor's 78L05 is an example, may be used.

Laser diode 20 current flows from the output of voltage regulator 19 to ground via the collector to emitter path in transistor pass element 21. Transistor pass element 21 is base connected to the output of operational amplifier 22. Monitor photodiode 23 produces a current proportional to the irradiance (optical output power) from the laser 20, and is connected via resistor 24 to ground. Transistor pass element 21 is controlled by the feedback voltage developed by the photocurrent from photodiode 23 passing through resistor 24 via the operational amplifier 22 which operates as an analog differential amplifier. A control or reference voltage, Vcontrol, to operational amplifier 22 also sets the irradiance from laser diode 20, as discussed in Eastman et al U.S. Pat. No. 5,200,597 issued Apr. 6, 1993 (see FIG. 14 thereof).

This circuit also permits the use of a scanner with a supply voltage below 4.5V, and specifically at 3.3V for $V_{dd}$. As the ambient temperature rises, the forward voltage drop of the laser diode 20, like most solid-state laser diodes, increases. When the ambient temperature nears the operating limit of the laser diode, its forward breakdown voltage can be as high as 3.2 volts, hence, if a 3.2V power supply is used, any forward voltage drop across the transistor pass element 21, which is supplying the laser's operating current, causes laser diode 20 to stop conduction. As a result of the above, the optical output of laser diode 20 is reduced, consequently the photodiode 23 current is reduced. Amplifier 22 detects an increased error voltage (Vcontrol-Vfb), and increases the base-drive of transistor 21. However, since there is insufficient supply voltage for laser diode 20 to conduct, the increased base current produces no increase in photodiode 23 current. The error amplifier 21 continues to increase transistor 21's base current until its limit is reached. At this point the control loop (formed by amplifier 22, transistor 21, laser diode 20, photodiode 23 and resistor 24) is saturated. Should Vdd increase above the hypothetical 3.3 volts, the laser diode would resume conduction, but because the transistor base current is now considerably higher than is required to conduct the "nominal" laser operating current, a current spike passes through the laser, causing it to monetarily exceed its rated optical output power. As laser diodes are extremely sensitive to excessive optical power operation, the current spike can destroy or at least severely reduce the laser's expected life. However, this condition is avoided because when Vdd=3.3 volts the charge state is enabled continually at the system clock rate and for half the duty cycle of the system clock. The voltage into the voltage regulator 19 is doubled by the operation of charge pump 10 and remains at nearly 6.0 volts, well above the regulation voltage of voltage regulator 19. Thus regulator 19 is able to supply a constant voltage to laser regulator 1 that sufficiently exceeds laser diode 20's forward conduction voltage allowing it to reliably operate.

Figure 1A:
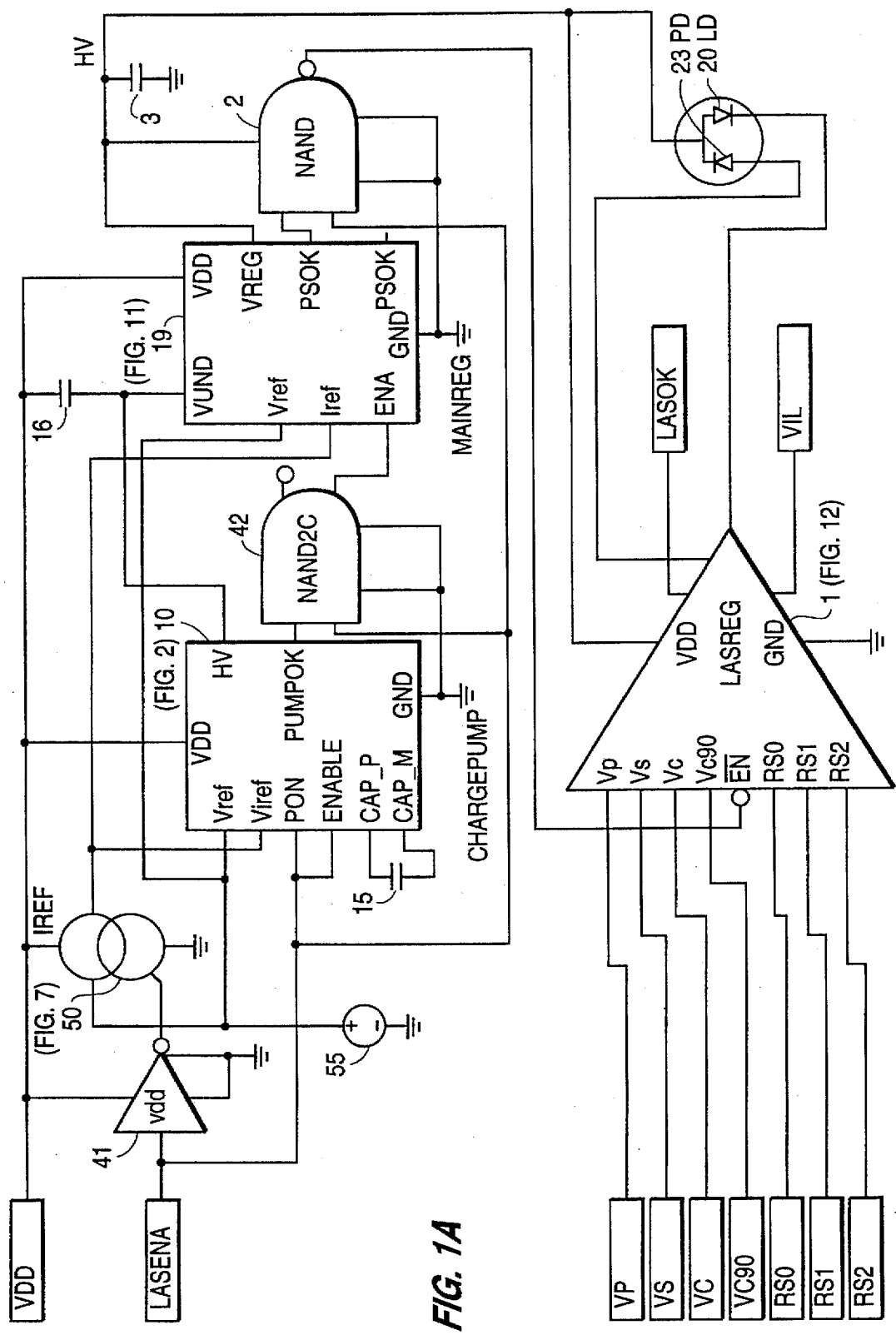
FIG. 1A is a diagram of the system operative in accordance with the same principles as the system of FIG. 1, but using MOSFETs suitable for fabrication by bulk CMOS techniques as on application specific to integrated circuit or ASIC.

Referring to FIG. 1A, there is shown a MOSFET implementation of a system using the principles of FIG. 1 which functions efficiently over a variety of environmental conditions. The FIG. 1A system has the following additional features: (A) the voltage doubler or charge pump 10 is adaptive to circuit conditions and operating environment (e.g. changes in temperature, component value, tolerances, etc.) by monitoring the charge and discharge currents through capacitor 16 and controlling the durations of the charge and transfer states in response thereto; (B) The charge current into capacitor 15 is limited during the charge state, thereby reducing current demands of the system.

Rather than charging and transferring for fixed periods of time, as controlled by the fixed-frequency system clock depicted in FIG. 1, the charge pump can be made to charge until it finishes charging and transfer charge until there is no more charge to be transferred. Charging is complete when the voltage across capacitor 15 reaches a fixed threshold slightly below $V_{dd}$, or alternately, when the charge current drops to zero. Once charging is complete, transfer mode is initiated.

Likewise, the charge transfer from input capacitor 15 to output capacitor 16 is completed when the current in capacitor 16 reverses direction. While charge is being transferred, current flows from capacitor 15 into capacitor 16 through diode 18; then $I_{charge}$ is positive. As the excess charge in capacitor 15 is depleted $I_{charge}$ drops to zero. Once all excess charge is depleted from capacitor 15, its voltage is one diode drop higher than the voltage across capacitor 16, capacitor 16 begins supplying the load current requirement, as indicated by a negative $I_{charge}$ current. Hence, a direction reversal of $I_{charge}$ provides an indication that charging is completed and capacitor 15 has no more charge to deliver.

$I_{charge}$ may be monitored to determine when the transfer has been completed, and the voltage across capacitor 15 or alternately, the current charging capacitor 15 may be monitored to determine when charging is completed. Thus, the circuit adapts to its load and environmental conditions by charging until capacitor 15 is charged and transferring charge until there is no excess charge to transfer. Thus, control of the supply voltage for the laser diode is "adaptive" to circuit conditions. The following advantages are also provided because of the adoptive feature. First, the voltage-doubler produces the highest possible output voltage for given environmental conditions (load, temperature and input supply voltage). Second, the maximum output voltage can be selected and easily limited in response to the voltage sensed across capacitor 15. By limiting the peak voltage across capacitor 15 to less than Vdd, the charge pump output can be varied between Vdd and 2*Vdd.

When fabricated using a bulk CMOS fabrication technology MOSFETs (especially MOSFET devices with gates of polysilicon instead of metal), have relatively high on-resistances. As a result, very large area devices are required to construct a charge-pump that has a low enough output resistance to supply even meager current to a load. Further complicating matters is the fact that temperature and system power supply voltage drastically effect MOSFET charge-pump output resistance. The invention teaches how to accommodate normal environmental variations without degrading the performance of the charge-pump.

FIG. 1A shows an implementation of the embodiment of FIG. 1 as applicable for fabrication using bulk CMOS technology as is customarily employed in digital ASIC design. Like reference numbers as used in FIG. 1 also designate equivalent circuits in FIG. 1A, when applicable. Circuits include: band-gap voltage reference 55, current reference 50, charge-pump 10, voltage regulator 19, and pulsed laser power regulator 1. Logic gates 2, 41 and 42 combine the various monitor signals, generated by monitoring circuits within each circuit, to insure that successive stages do not operate until the prior stages are stable. Several input signals to the circuitry of FIG. 1A are supplied by a microprocessor or additional digital logic of the scanner not shown in this application. A description of these signals follows.

VP is a digital clock signal that controls the laser pulsing. The frequency of VP controls the laser chop frequency and its duty-cycle controls the laser's optical pulse duty-cycle to conserve bar code scanner operating power and/or satisfy governmental regulations for laser emissions See U.S. Pat. No. 5,109,698 issued to J. Eastman, May 28, 1991 and U.S. Pat. No. 4,639,606 issued to J. Boles and J. Eastman, Jan. 27, 1987.

VS is a digital sampling clock used to control sampling of the current through photodiode 23. VS has a certain phase relationship with respect to VP may be controlled.

VC and VC90 are analog control voltages, generated by a digital-to-analog (D/A) converter that controls the emitted laser optical power. Optical power control is the subject of another application patent application covering the invention of E. Coleman and S. Grodevant and owned by the assignee hereof, U.S. Ser. No. 08/296,788 filed Aug. 26, 1994. VC is adjusted for each individual laser diode to produce the desired optical power output. A calibration procedure when the system is built may be used. VC90 is an analog voltage 90% of VC. It can be produced by a voltage divider from VC. VC90 is used in the generation of the LASOK output.

RS0 through RS2 are digital inputs that select the resistance between the PD input and ground. The resistance established by the RS0 through RS2 inputs is equivalent to resistor 24 in FIG. 1. This variable resistance allows the circuit to compensate for differences in the optical power output vs. current characteristics common to commercially available, solid-state laser diodes.

LASOK is a digital output signal that informs circuitry that the laser's optical power is within 90% of its calibration value. This output is used to inform the microprocessor or external circuitry that the laser is properly operating.

VIL is an analog output voltage whose value is proportional to the laser's operating current. It is monitored by the microprocessor or external circuitry to prevent laser diode destruction under too high ambient temperature conditions, and as a diagnostic tool for manufacture and is similar to the ILS signal discussed in Eastman, et al U.S. Pat. No. 5,200,597 issued Apr. 6, 1993.

Figure 2A:
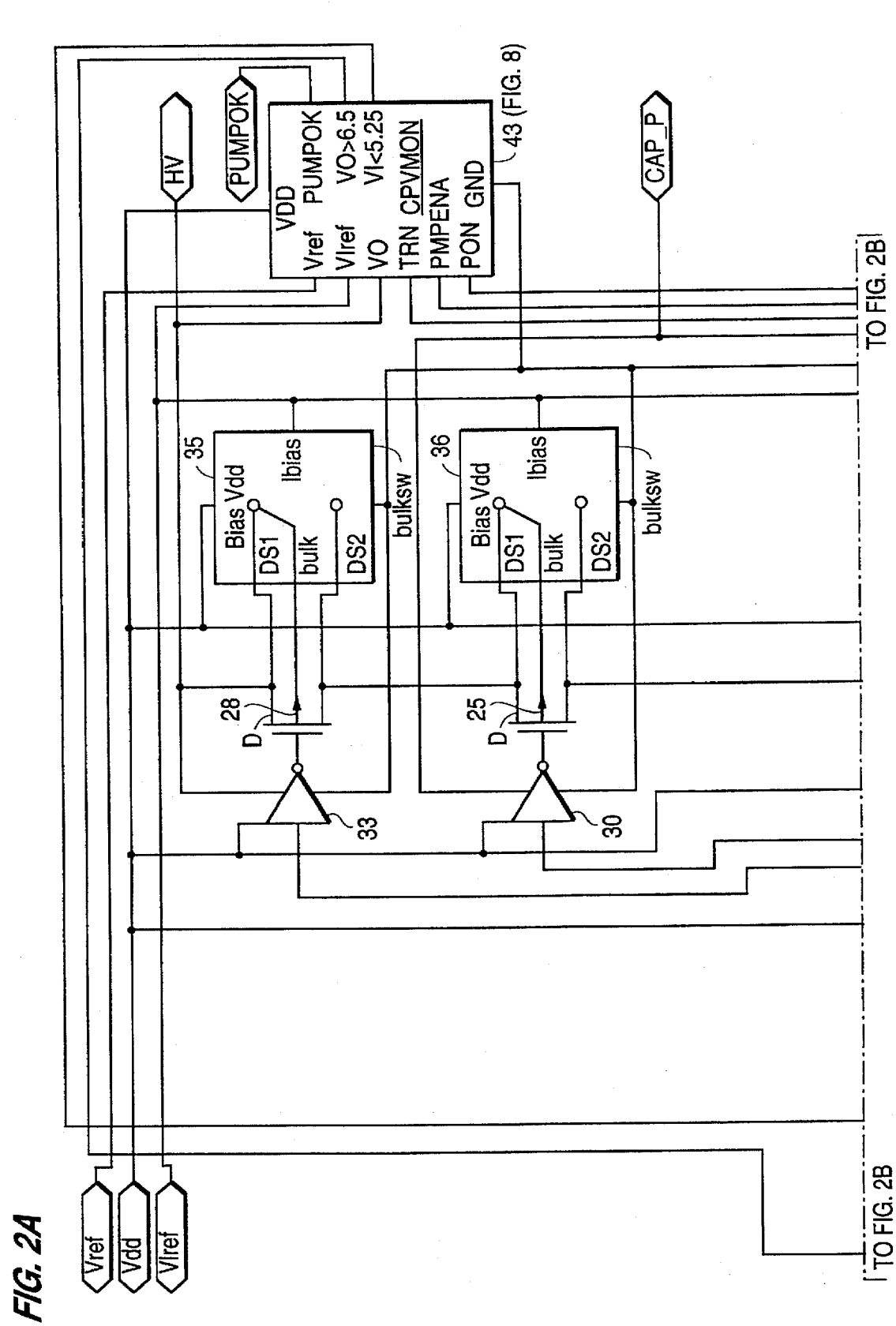
Figure 2B:
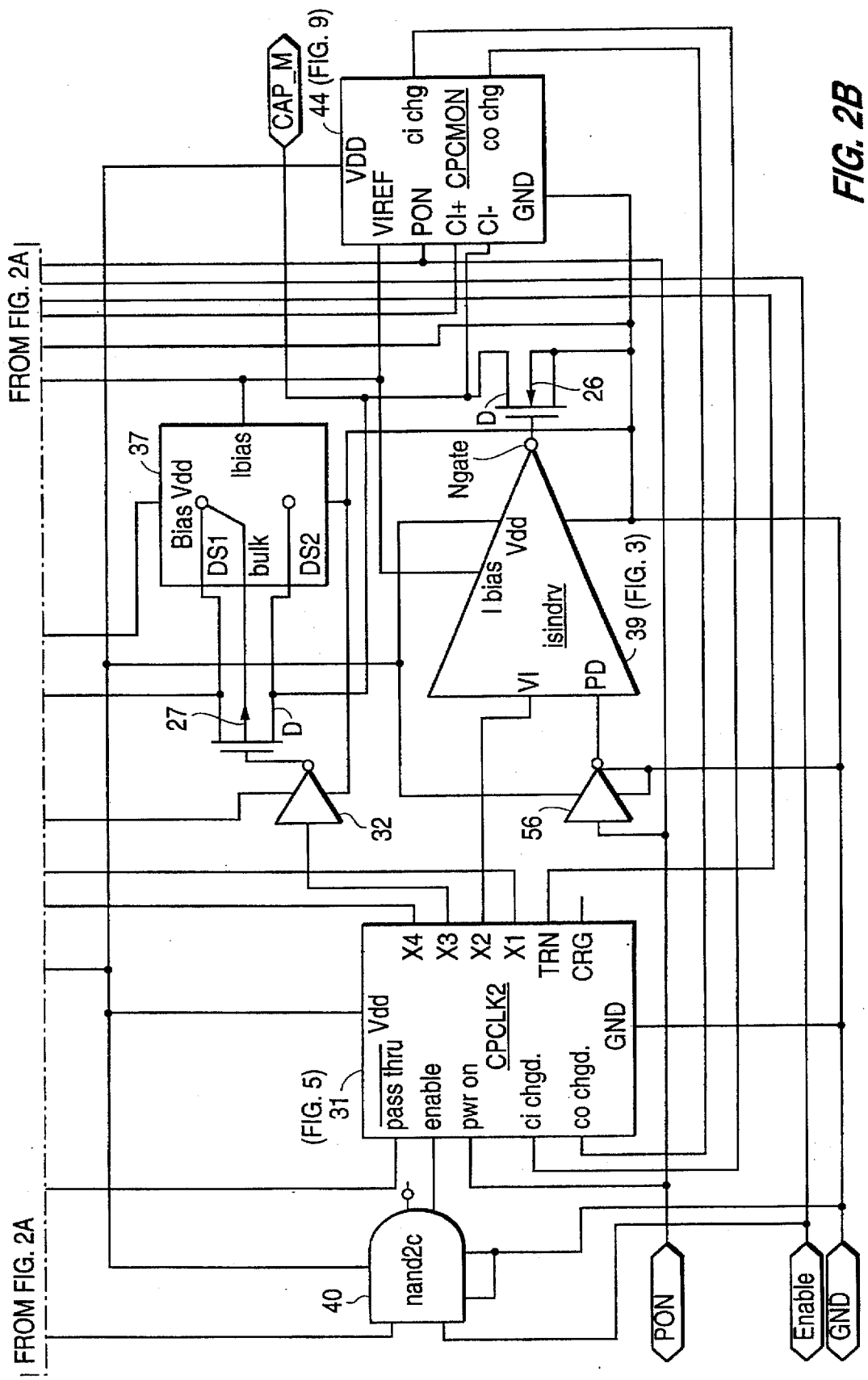
Figure 3:
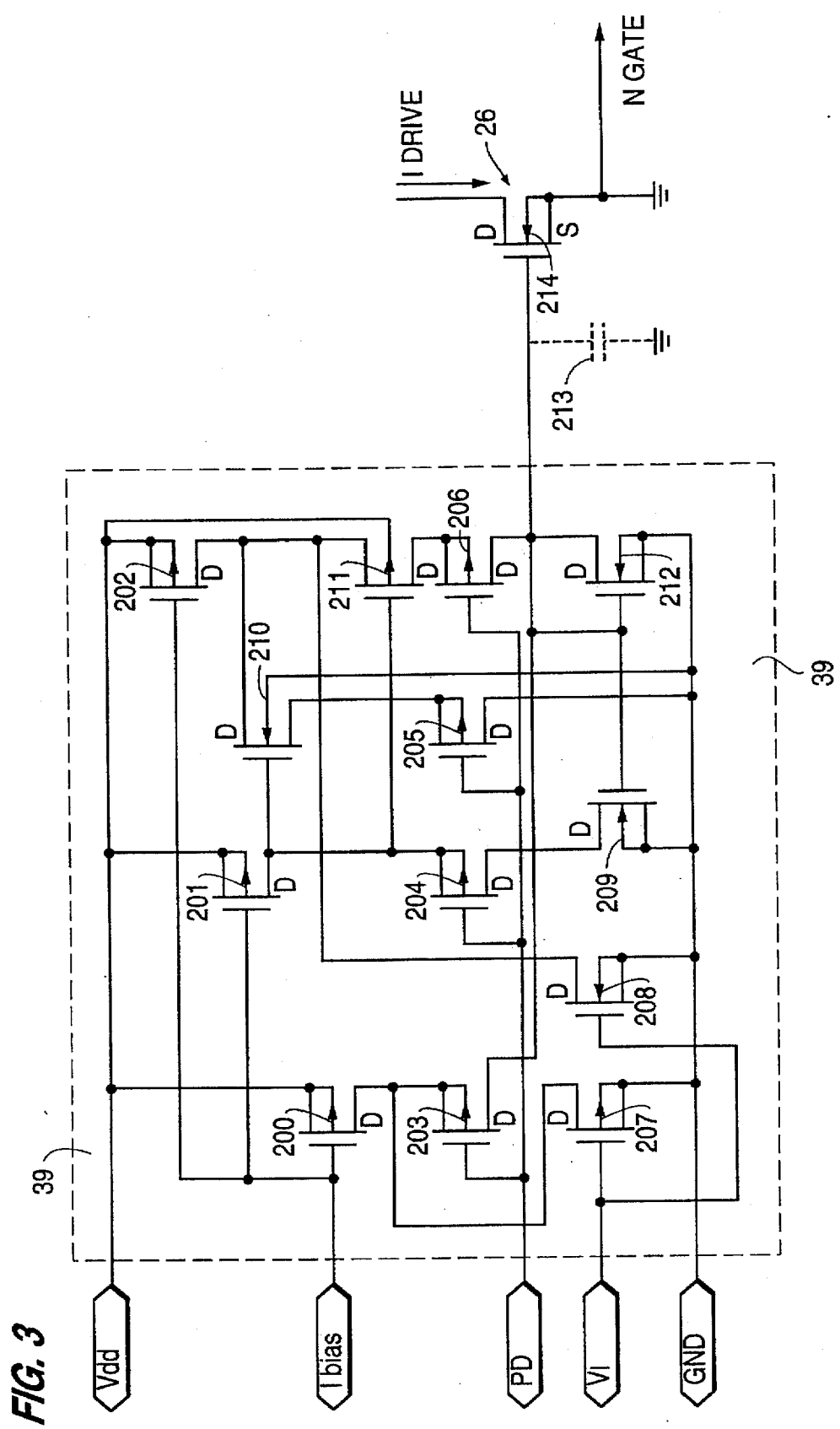
FIG. 3 is a schematic diagram showing current and slew rate limited driver 39 of FIG. 2 in greater detail.

Referring to FIG. 2, adaptive control is used to control MOSFET drivers which replace the diodes 17 and 18 in the integrated circuit provided by the invention. In general, during the pump's charge state, drivers 25 and 26 are switched on and drivers 27 and 28 are off. Thus capacitor 15 positive terminal is connected to $V_{dd}$ through driver 25 and the negative terminal of capacitor 15 is connected to ground through driver 26. Conversely, during the transfer state, drivers 27 and 28 are on and drivers 25 and 26 are off, effectively connecting the capacitor 15 positive terminal to the capacitor 16 positive terminal (node Vz FIG. 1) and capacitor 15 negative terminal to capacitor 16 negative terminal (via Vdd). Level translators 30, 39, 32 and 33 convert the logic levels (zero and $V_{dd}$) to the levels required to drive the gates of MOSFETs 25, 27 and 28. The driver circuit 39, provides surge current limiting and slew-rate control for the NMOS driver 26. The driver circuit 39 is shown in FIG. 3. The MOSFETs may be constructed using one or more FETS in parallel, the number of FETS and the width and length of their oxide channels is selected to meet current carrying requirements. For example, driver 25 may be made up of 180 FETS each of 3 micron by 100 micron (length×width) channel dimensions.

Control logic 31 responds to two control signals from the microprocessor of the scanner to enable the charge pump, or place it in power-conservation (low-power) mode. These control signals are called ENABLE and PON respectively. Typically these two signals are driven by the same output, LASENA, as shown in FIG. 1A, and are therefore logically equivalent. Capacitors 15 and 16 of FIG. 1 are used in FIG. 2 for the same purpose that they were used in FIG. 1. MOS power drivers 25, 26, 27 and 28 control the charging of capacitor 15 and the transfer of charge from capacitor 15 to capacitor 16.

Figure 4:
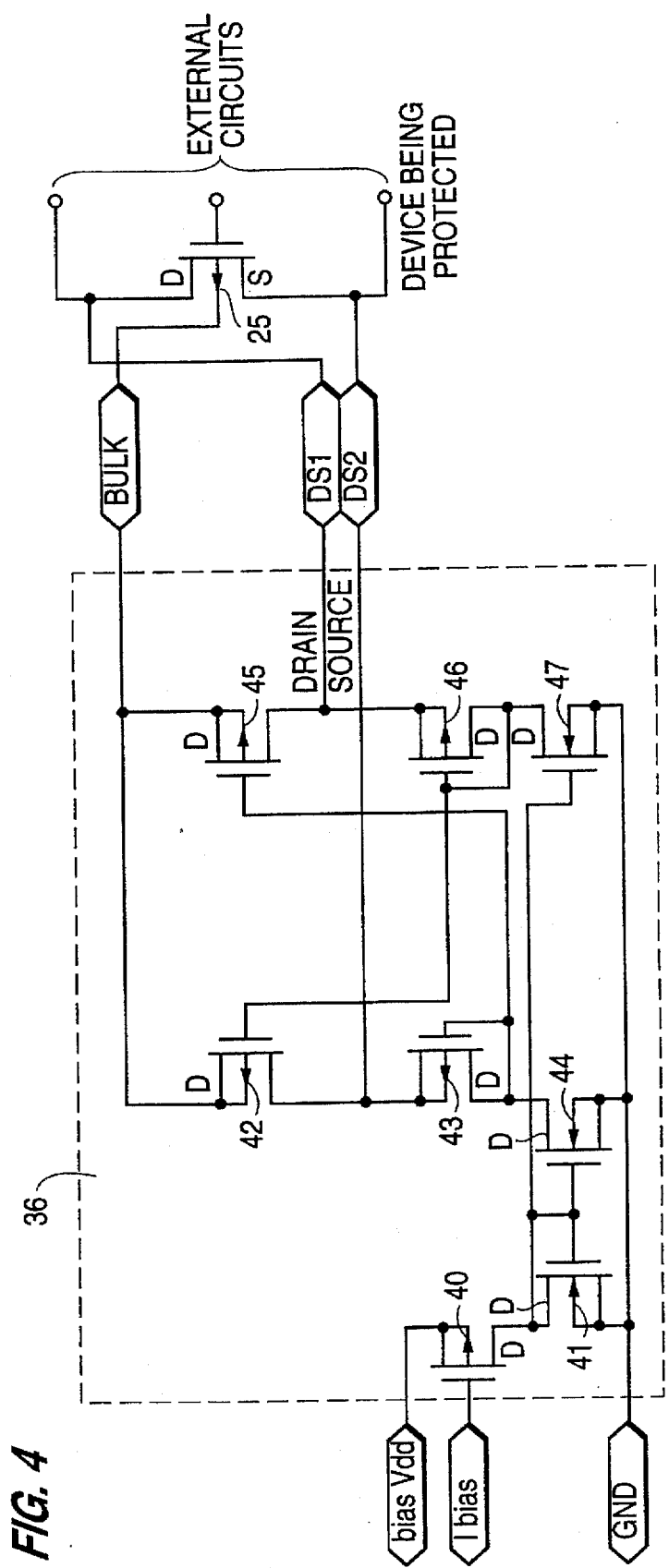
FIG. 4 and FIG. 4A is a schematic diagram showing the gate or bulk switch circuits 35–37 of FIG. 2 in greater detail.
Figure 4A:
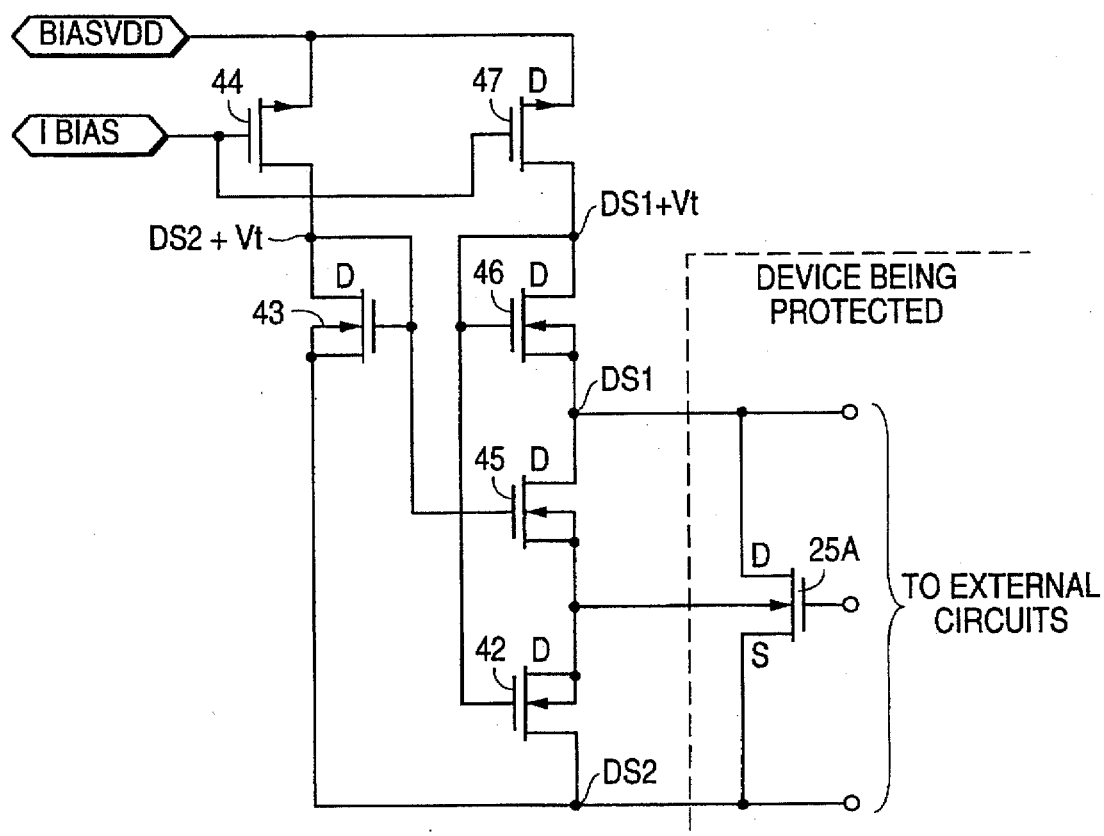
Figure 8:
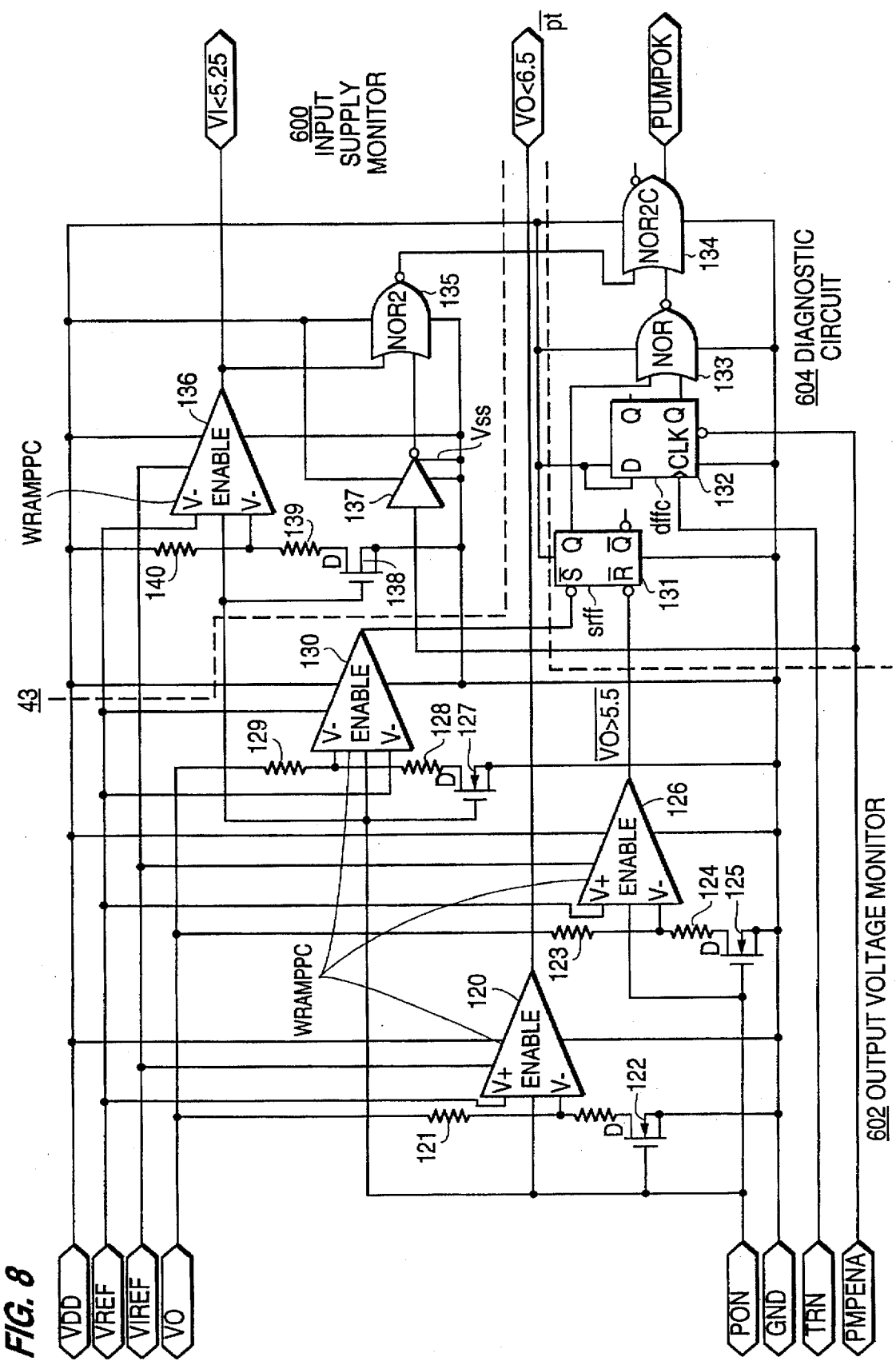
FIG. 8 is a schematic diagram of the voltage monitor (CPVMON) 43 of FIG. 2 in greater detail.

Bulk switching circuits 35, 36 and 37 prevent excess bulk current circulation in drivers 25, 27, and 28. The details of these circuits are shown in FIG. 4 and 4A. Circuit 43, whose schematic is shown in FIG. 8, contains three voltage comparators that monitor the charge pump output (labeled $V_o$), and the input power supply (labeled $V_{dd}$), to provide three states of information: "pumpok", "pt" and "Vo<6.5". The "pumpok" output is a logic level indicative of whether that charge pump output is within acceptable operating limits. The not "pt" signal (inverted), stands for "pass-through", and informs the control logic that the input power supply voltage (Vdd) is high enough that the pump need not operate (this serves the same purpose as comparator 12 of FIG. 1). Finally, the "Vo<6.5" signal protects the integrated circuit by preventing the charge pump output at HV from exceeding a predetermined upper threshold value (6.5 volts in this embodiment). Gate 40 combines the microprocessor command for charge-pump operation, labeled "enable", with the protection signal "Vo<6.5" to enable or disable charge-pump operation. The "Vo<6.5" signal is necessary because the charge-pump circuit is capable of producing an output voltage high enough to potentially destroy the integrated circuit (by virtue of channel punch-through). Charge monitoring circuitry 44, illustrated in FIG. 9, monitors the charging and discharging of capacitor 15 directing control logic section 31 to select the proper operating state (charge or transfer).

Figure 5:
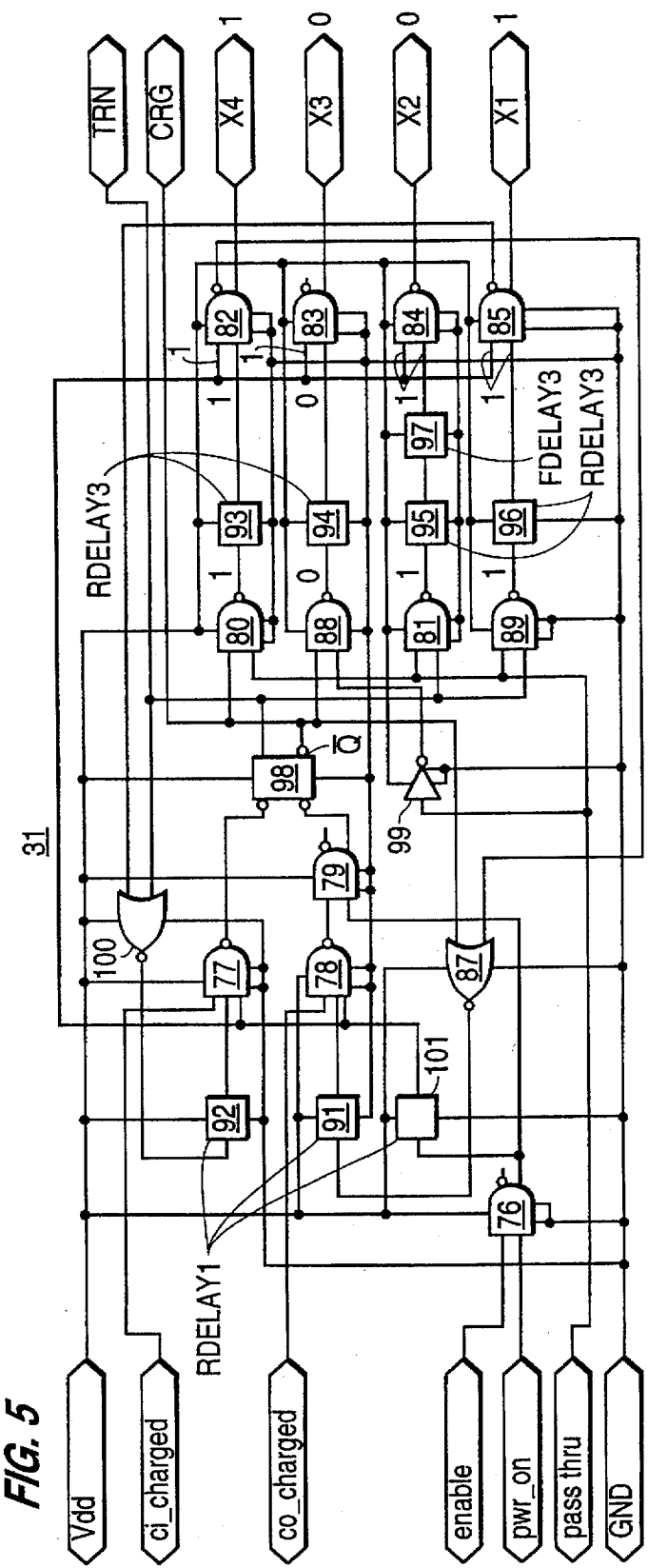
FIG. 5 is a schematic diagram showing control logic 31 of FIG. 2 in greater detail.
Figure 5A:
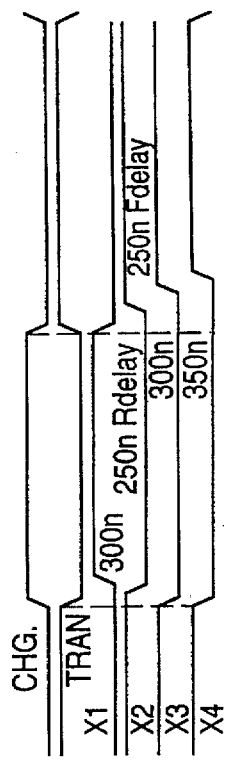
FIG. 5A is a timing diagram for control logic 31 shown in FIG. 5.

FIG. 5. shows the control logic 31 that controls the operating mode of the charge-pump by virtue of the gate control signal outputs X1 through X4. The control logic can be divided into two main sections: mode control and gate signal sequencing. Mode control logic, formed by gates: 76, 88, 77, 78, 79, 87, invertor 99, a set-reset flip-flop 98 and delay circuits 92, 91, and 101 (see FIG. 6 for details). Flip-flop 98 controls the operating state of the pump and state transitions. The gate signal sequencing section, composed of gates 80–85, and delay circuits 93–97, skews in time the gate control signals X1, X2, X3 and X4 to MOSFET drivers 25, 26, 27 and 28 to compensate for their different switching times and to insure that drivers 25 and 26 are not on at the same time as drivers 27 and 28. The skewing of the gate signals effects the charge-pump operating efficiency and the bulk current in the NMOS drive FET 26. Excess bulk current flow causes a phenomena called "latch-up" which is a destructive mechanism within CMOS integrated circuits whereby structures used to fabricate the MOSFETs form SCR-like structures between $V_{dd}$ and ground of the integrated circuit. Excess bulk current triggers the "gate" of the SCR structure causing high current flow through the integrated circuit that ultimately destroys it. The time relationship of skew of the gate control signals for typical charge and transfer durations is shown in FIG. 5A.

Figure 9:
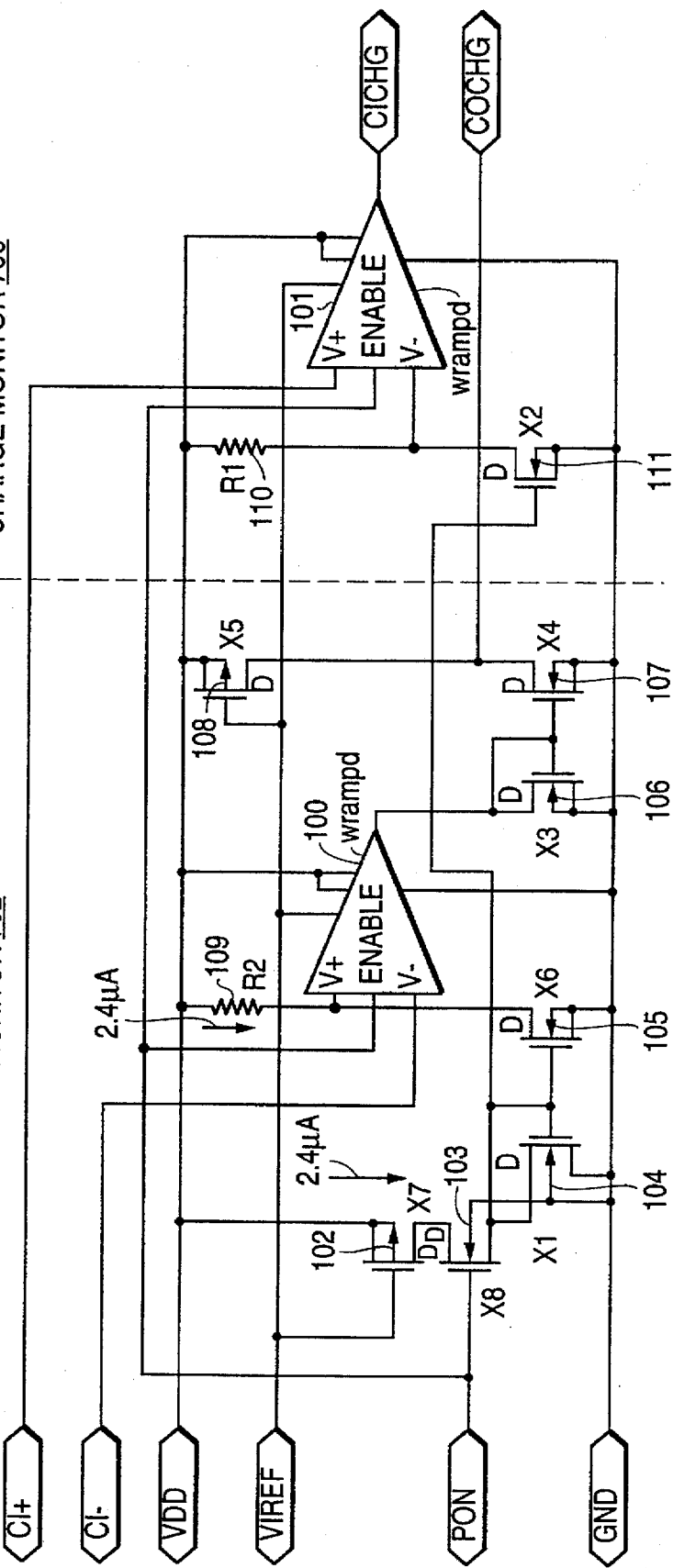
FIG. 9 is a schematic diagram showing the charge monitor (CPCMON) 44 of FIG. 2 in greater detail.

FIG. 9 shows two voltage comparators 100 and 101, in CPCMON 44, that monitor the charge and discharge of capacitor 15. In the preferred embodiment, the voltage across capacitor 15 is monitored to determine when charging is complete. The current through capacitor 15, as it interacts with the drain resistance of driver 25 to produce a voltage, is monitored to determine when transfer is complete.

The charge pump shown in FIGS. 1A and 2 is adaptive because it adjusts its operating frequency (the rate at which it toggles between charge and transfer modes) to its load and circuit conditions, including environmental conditions i.e., temperature, and input power supply voltage $V_{dd}$. By adjusting its operating frequency in this manner, the circuitry insures that the maximum charge pump output voltage is generated for a given set of circuit and environmental conditions.

Consider now normal adaptive charge pump operation. The charge pump is enabled by setting PSENA and PON ($V_{enable}$ and $V_{pwron}$) to their active (high) states. Amplifier 120 (FIG. 8) acts as a voltage comparator whose inverting input is connected to the output of the voltage divider formed by resistors 121 and 122. Amplifier 120 non-inverting input is driven by a band-gap voltage reference 55 (FIG. 1A) whose nominal output voltage is 1.183 volts. Specific voltages and currents are those produced in a practical embodiment of the invention and are given only to facilitate exposition of the invention. They will vary depending upon choice of battery voltage and other component values.

Resistors 121 and 122, in conjunction with voltage reference 55 establish a threshold voltage of 6.5 volts. The output of amplifier 120 is the "−pt" input to control logic 31 (FIG. 5). When $V_{dd}$ exceeds the threshold voltage, the "−pt" signal is driven low, indicating that the charge-pump is to operate in "pass-through" mode. There may be a short time delay between the application of power ($V_{dd}$) and the assertion of $V_{enable}$. The mode flip-flop 98 (FIG. 5) is initialized to its charge state (cleared) through AND gate 76, LDELAY 92, NAND gate 78 and AND gate 79. After the delay created by LDELAY 92 has expired, the "dlyena" signal is asserted causing the X1 through X4 outputs to assume their charging states: 1, 0, 0, 0, respectively, activating drivers 25 and 26 and turning off drivers 27 and 28 effectively placing input capacitor 15 between $V_{dd}$ and ground where it is charged until charge mode is terminated. As mentioned earlier, the in-rush current into capacitor 15 is controlled by ISLNDRV 39, whose operation is discussed hereinafter.

Amplifier 101 (FIG. 9) is used as a voltage comparator, comparing the voltage at the positive terminal of capacitor 15 (non-inverting input) with the voltage developed at the junction of resistor 110 and NMOS 111 (inverting input) to determine when capacitor 15 has charged. The voltage at the inverting input of amplifier 101 is set slightly below Vdd (by the selection of resistor 110 and the drain current of NMOS 111) to insure that voltage offset errors within amplifier 101 do not inhibit comparison. When the potential at the positive terminal of capacitor 15 exceeds the resistor/NMOS junction voltage, amplifier 101 output switches high indicating a "cicharged" condition. Amplifier 101 output is the cicharged input shown on FIG. 5.

NAND gate 77 detects the cicharged signal and the output of LDELAY 76, to set mode control S-R flip-flop 98 into the transfer state (high). The purpose of LDELAY 76 is to insure that amplifier 101 has settled after the pump switches from the transfer to charge state. During the transfer state, amplifier 101's non-inverting input is driven to nearly $2*V_{dd}$ which is beyond its common-mode range. When the pump switches back to the charge state, amplifier 101 output remains invalid for several microseconds, and LDELAY 76 inhibits a state change until amplifier 101 has had sufficient time to settle. NOR gate 88, whose output drives LDELAY 76, acts as a charge state qualifier enabling a state change from charge to transfer only after X1 ends (the last output signal to change state when the pump enters into the charge state, as shown in FIG. 5A).

Once the mode S-R flip-flop 98 sets, the charge-pump enters its transfer state during which time charge accumulated in capacitor 15 is transferred to capacitor 16 and the load. The logic outputs, X1 through X4 assume their transfer states, 0, 1, 1, 1, respectively, as controlled by logic gates 80, 81, 88 and 89. These logic levels enable drivers 27 and 28 and disable drivers 25 and 26, effectively connecting capacitors 15 and 16 in parallel. As charge is transferred between capacitors 15 and 16, a "transfer current" circulates from the positive terminal of capacitor 15, through driver X4 into capacitor 16 positive terminal, out of capacitor 16 negative terminal, through driver 23 and back into the negative terminal of capacitor 15. This transfer current interacts with the channel resistance of driver 27 to produce a voltage (across its drain and source terminals). This magnitude of this voltage is apparent from the drain current equation for a MOSFET operating in its linear region for Vsd as a function of Id. Since the source of driver is connected to $V_{dd}$, the drain voltage of driver 27 approaches $V_{dd}$ as the transfer current approaches zero. Amplifier 100 (FIG. 9) inverting terminal is connected to the drain of driver 27 and its non-inverting terminal is attached to the junction of resistor 109 and NMOS 105. NMOS 105 passes a constant drain current; thus biasing amplifier 100 non-inverting input at a voltage approximately 35 millivolts below $V_{dd}$.

The output of amplifier 100 is a transfer complete indicator; switching high when the transfer current drops below a predetermined threshold value, nominally in the 10 to 20 milliampere range. The amplifier 100 output is labeled "cocharged" and is connected to NAND gate 78 (FIG. 5). NAND gate 78 responds to the output of NOR gate 87 whose rising-edge is delayed by LDELAY circuit 91. NOR gate 87 acts as a transfer state qualifier, indicating that the pump is operating in the transfer state and that the output signals have settled (the skewing delays have elapsed) when the NOR gate 87 output switches high. LDELAY circuit 91 inhibits changing state amplifier 100, which like amplifier 101, is operated beyond its common-mode input range when the pump is in an "alternate" state. More specifically, when the pump is in its charge state, the inverting input of amplifier 100 is driven nearly to ground, which is beyond the common-mode range of this amplifier. After the pump switches to the transfer state, amplifier 100 requires less than one microsecond to settle before its output is valid. LDELAY 91 provides this delay, thus preventing false state transitions.

As long as the charge-pump remains enabled, and its output remains below 6.5 volts, as directed by the Vo<6.5 signal, the foregoing operation repeats indefinitely.

FIG. 5A shows how the control logic 31 output signals X1 through X4 are skewed to compensate for the delays encountered by level translators 30, 32, 33, ISLNDRV 39, and the gate capacitance of drivers MOSFET 25, 26, 27 and 28, which load the level translators. Signal skewing is accomplished by RDELAY circuits 93 through 96 and FDELAY circuit 97. RDELAY circuits delay only the positive-going edge of a signal and FDELAY circuits delay the negative-going transitions of a signal. Since neither circuit inverts the original signal, when cascaded they delay a pulse, nonsymmetrically, in time. The PC parameter of each inverter of a RDELAY or FDELAY circuit (204, 205, 207—FIG. 6) controls that invertor delay. As mentioned earlier, the charge-pump efficiency and the driver 26 bulk current depend upon the signal skewing. The skewing is effected by such variables as $V_{dd}$, temperature, nominal pump output voltage (Vo), and driver FET dimensions.

To insure system integrity within the scanner employing the charge-pump of this application, the monitor circuit 43 (FIG. 2), whose schematic is shown in FIG. 8, is included. This circuit monitors charge pump operation and indicates to other circuits within the scanner that the charge-pump is operating properly.

The monitor circuit 43 is shown in FIG. 8. There are six inputs, namely VREF (a band-gap voltage reference), VIREF (a current reference), Vo (the charge-pump output voltage), TRN (a signal indicating that the pump is operating in its transfer state), and PMPENA (the pump enable signal).

There are three outputs, namely Vi<5.25 (that is connected to −pt in FIG. 2), Vo<6.5 (that connects to AND gate 40 on FIG. 2), and PUMPOK (that connects to circuitry within the scanner not shown.

Amplifiers 126 and 130 are operated as voltage comparators that monitor the charge-pump output voltage to determine if is within acceptable limits for operating the laser regulator 19 (FIG. 1A) and any other circuits that may be attached to the charge-pump output. The PON input signal places the monitor circuit 43 in low-power mode by disabling the internal amplifier bias currents, and turning-off NMOS switches 122, 125, 127 and 138, effectively open-circuiting the four voltage dividers formed by resistors: 121, 122; 128, 129; 139, 140; and 123, 124.

The inverting input of amplifier 130 is connected to the band-gap voltage reference 55 (FIG. 1A) and its non-inverting input is connected to the voltage divider formed by resistors 128 and 129, whose values are chosen to produce a 5.3 volt threshold voltage (relative to Vo). Similarly, amplifier 126 is configured, using resistors 123 and 124, to produce a threshold voltage of 5.5 volts. Amplifier 130 drives the set input (active low) of S-R flip-flop 131 and amplifier 126 drives the flip-flop 131 reset (active low) input. In this configuration, flip-flop 131 is set when the pumps' output is invalid (less than 5.3 volts) and cleared when valid (greater then 5.5 volts). D flip-flop 132 is cleared when the pump is disabled (enable logic low or false), and set upon completion of the first charge cycle (rising edge of transfer state). NOR gate 133 logically combines the two flip-flop output so as to produce a high logic level when a transfer state has been initiated and the pumps output has been greater than 5.5 volts and has not dipped below 5.3 volts. The aforementioned circuitry provides hysteresis so that the PUMPOK output does not toggle in the presence of electrical noise or pump state cycling when the output is near the operational threshold. As mentioned above, amplifier 136 is configured as a voltage comparator whose output is high when the pump output is above 5.25 volts. This signal is logically combined with the pump enable signal, inverted by invertor 137, and by NOR gate 135, so as to produce a high level when the pump is operating in its pass-through mode (analogous to the circuit of FIG. 1 when the system clock was disabled by AND gate 11). Finally, OR gate 134 combines the outputs of NOR gates 133 and 135 to form the PUMPOK output. From the foregoing discussion, it is apparent that the PUMPOK output is high when the pump's output is greater then 5.3 volts and has exceeded 5.5 volts, and the pump has performed at least one charge transfer, or, the pump is enabled and operating in pass-through mode.

Two environmental conditions alter charge pump operation, which are supply voltage ($V_{dd}$) dependent. When the system power supply ($V_{dd}$) exceeds 5.25 volts, the charge-pump is not needed to boost the supply voltage, instead the pump operates in what's called "pass-through" mode. In this mode, drivers 25, 26 and 28 are on and driver 27 is off, effectively connecting $V_{dd}$ to the pump output (Vo) and the positive terminal of capacitor 15. At the same time, the negative terminal of capacitor 15 is connected, through driver 26 to ground, thereby maintaining capacitor 15 fully charged and ready to supply power should the charge pump output fall below 5.25 volts (at which time the pt signal switches false causing the pump to begin a transfer cycle). The pt (and −pt signal generated by invertor 99) and their interaction with logic gates 80, 81, 88 and 89 produce the required logic levels to enable drivers 25, 26 and 28 while disabling driver 27, when pt is active.

In cases where $V_{dd}$ is less than 5.25 volts but above approximately 3.9 volts, the charge-pump is capable of producing output voltages in excess of 6.5 volts. The voltage regulator that follows the charge-pump 19 FIG. 1A, requires just 5.3 volts to regulate its output to five volts. A pump output beyond 5.3 volts just increases the regulator's internal power dissipation. Thus, the charge-pump output is limited, by amplifier 120, which is operated as a voltage comparator, to approximately 6.5 volts. As noted above, amplifier 120 in (FIG. 8), in conjunction with resistors 121, 122 and voltage reference 55, form a voltage comparator whose output switches to a low logic level (approximately zero volts) when the charge-pump output ($V_o$) exceeds 6.5 volts. When this happens AND gate 40 inhibits the enable signal supplied to control logic 31 (FIG. 5 enable). The S-R flip-flop 98 is then switched into the charge state. As long as $V_o$ remains above 6.5 volts, charge pump operation is suspended. Once $V_o$ drops below 6.5 volts, normal (transfer) operation, resumes. The charge-pump, thus participates in output voltage regulation, as well as preventing the voltages from exceeding channel punch-through voltage of the FETS.

Having covered the operator of the charge-pump, especially in its MOSFET implementation, as shown in FIGS. 1A and 2 and the details of certain circuits thereof (in connection with FIGS. 5, 5A, 6, 8 and 9), consider next the details of these and other circuits used in this implementation.

Referring to FIG. 3, there is shown in greater detail the current and slew rate limited N-MOS driver 39 of FIG. 2 and indicated thereon by the legend ISINDVR. Current and slew rate limited driver 39 performs two functions, namely it limits the maximum drain current through N-MOS FET 26, and it controls the rate at which NMOS FET 26 begins conduction, entering its conductive state from its non-conductive state. Current limiting reduces competition for operating power with other apparatus reducing power supply noise and filtering requirements. Rate control reduces bulk-current flow in the NMOS FET 26 thereby minimizing the possibility of latch-up.

Figure 7:
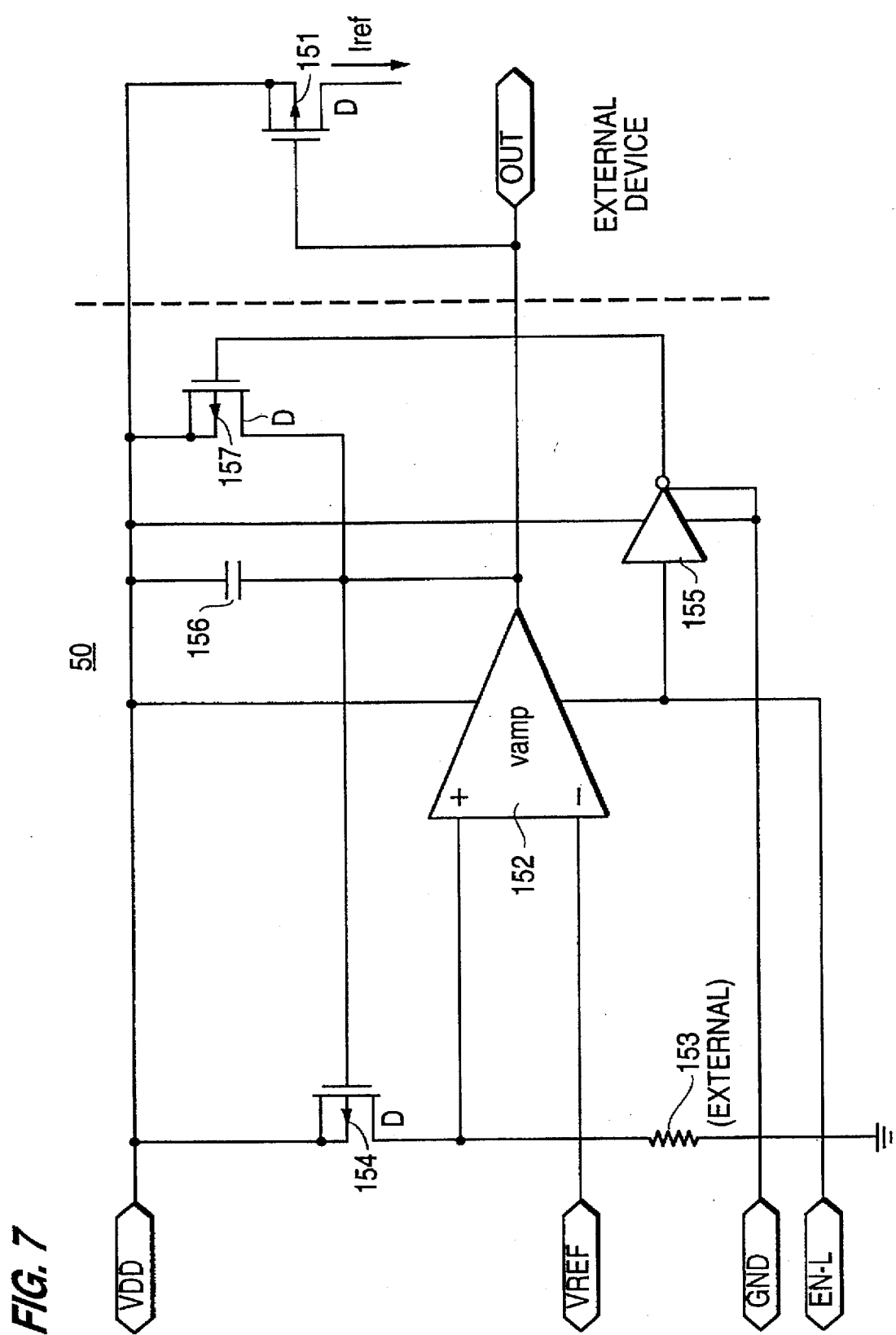
FIG. 7 is a schematic diagram showing $I_{ref}$ 50 of FIG. 1A in greater detail.

Driver 39 has three control inputs: Vi, PD and Ibias. Ibias is the output of current reference 50 (FIG. 1A and FIG. 7). P-MOS devices attached to the Ibias input (from Iref of the current reference 50) produce a constant current that is determined by the ratio of their sizes to P-MOS FET 151 of the current reference (FIG. 7). PD is a power-down input that reduces the bias current of the driver 39 to almost zero. Vi is the control input that turns on and off the output current drive to NMOS FET 26.

Driver 39 can be divided into five logical sections, namely (A) a "start-up" current reference using FETS: 200, 203, 207; (B) a "steady-state" current reference using FETS: 202, 211, 206; (C) a current comparator using FETS: 201, 204 and 205 and one of the current mirror FETS 209; (D) biasing FETS 208, 210; and (E) output driving mirrors using FETS 209 and 212.

Consider that in operation of the driver 39 and N-MOS 26, the drain current through NMOS 26 is proportional to the drain current of N-MOS 212 because N-MOS 212 and 26 are connected as a "super-mirror", and because both devices have equal channel lengths, in this case 3 microns. A super-mirror consists of a diode-connected device in parallel with the gate-source of a second device. The diode connected device is FET 212 and the gate-source is that of FET 26. Additional mirror devices can be placed in parallel with the diode-connected device. The drain current of N-MOS 26 is therefore proportional to the diode-connected FET 212 drain current according to: $Id_{26}=Id_{212} * W_{26}/W_{212}$. Similarly, FET 209 is a 1:1 mirror of FET 212 drain current.

The power down feature of driver 39 is implemented by switching FETS 203, 204, 205 and 206 off, when PD is high, thereby preventing current flow through FET 212 and also FET 26. The dimensions (channel width and length) of switching FETS 203 through 206 are chosen to provide negligible insertion loss when they are on.

When Vi is initially switched low, FET 207 is turned-off, allowing FET 200, whose gate is referenced at the output Iref of current reference 50, which is connected to the Ibias input of the driver 39, to supply a nominal 60 μA start-up current to charge the parasitic capacitance 213 of drive N-MOS 26 through FET 203. As the parasitic capacitance of N-MOS 26 charges, FET devices 26, 209 and 212 switch from their off-state to conduction state. During conduction the mirror current in device 209 increases in proportion to the NMOS 26 drain current. When the drain current of FET 209 equals the reference current produced by FET 201, which in this circuit 39 a preset proportion (e.g., 90%) of the current through FET 200 (the current threshold), the drain voltage with respect of ground of FET 201 drops to near zero (ground), turning on P-MOS FET 211. P-MOS FET 211 routes additional reference current, 240 μA in this example, produced by FET 102, via FETS 211 and 206, through transistor 212. The current slew (change) rate in drive N-MOS 26 is controlled by the reference current produced by transistor 200 and the parasitic capacitance of N-MOS 26 (which is 180 times larger than the capacitance presented at the gate 214 by the other devices connected to gate 214). When the drain current through FET 26 reaches 90% of the low-current threshold, the reference current at the output of the driver 39 (the gate 214 of FET 26) increases via FET 211 to its normal value to provide current limiting.

When the Vi input is switched high (to turn-off drive N-MOS 26), both current reference handling FETS 200 and 202 are clamped to ground diverting all current from mirror transistor 212 and thereby turning off output driver FET 26 after a short turn-off delay time.

Referring to FIG. 4 there is shown a typical one 36 of the bulk switch circuits 35–37 of FIG. 2 in greater detail. The other bulk switch circuits 35 and 37 are identical. The bulk switch circuit has five connection terminals: Bias Vdd, Ibias, DS1, DS2 and bulk. Bias Vdd is connected to the system power bus, $V_{dd}$. IBias is connected to the output of current reference circuit 50 (FIG. 1A & FIG. 7). DS1 and DS2 are connected to the drain and source of the P-MOS device 25 to be protected, these terminals are interchangeable. In the illustrated circuit, DS1 is connected to the drain of PET 25, and DS2 to the source of FET 25. Bulk is connected to the bulk terminal (n-well) of the P-MOS FET device 25 being protected.

The bulk switch circuit of FIG. 4A is similar to FIG. 4, but is adapted to protect N-MOS devices 25A that are fabricated with p-well in the substrate (called p-well technology) bulk or in dual-tub (both n and p wells in the substrate) technology.

Bulk switch 36 operates by monitoring the voltage at the source and drain terminals (relative to ground) of the P-MOS driver FET 25 and connects the bulk (n-well terminal) of the P-MOS FET to the highest potential terminal (source or drain). If both terminals are equal potential, one or the other is chosen as a result of random threshold voltage mismatches present in the circuitry, and when both drain and source voltages are equal, it does not matter which one is chosen. By connecting the bulk terminal to the higher potential of the source or drain terminals, the bulk switch circuit prevents bulk current flow by preventing the bulk diode (formed by a PN junction between the drain and n-well or source and n-well) from becoming forward biased. Bulk current flow is prevented even though, during change pump operation, the voltage polarity of the drain and source terminals (with respect to one and other) of the FET 25 reverses each time the charge pump cycles between charge and transfer states. In addition to connecting the bulk terminal to the higher potential terminal, the response time of the bulk switch circuit is fast enough to prevent transients, on either the drain or source terminal of the device being protected, from momentarily inducing bulk current flow. The FET drivers protected with this circuit are made immune to bulk current flow during their typical operation.

Referring again to FIG. 4, FET 40 is connected to the output of current reference 50 to produce a constant bias current 2.4 μA, in this example. This current flows into diode-connected FET 41 and is mirrored by FETS 44 and 47. The mirror currents of FETS 44 and 47 flow through two diode-connected FETS 43 and 46, respectively, whose dimensions are chosen to produce a voltage drop equal to the conduction threshold voltage of protected FET 25, commonly called $V_t$. The voltages at the drains of devices 43 and 46 are one threshold voltage drop below the source and drain of the FET device 25 being protected, respectively.

FETS 42 and 45 form a switching network that connects the bulk terminal of the device 25 being protected to either its drain or source. The gates of devices 42 and 45 are cross-connected to the drains of devices 43 and 46, respectively. In operation, when the voltage at the source of the FET device 25 being protected is less than the voltage at its drain, device 45 is on and has a larger source-gate potential than device 42. Then the dynamic channel resistance of FET 45 becomes less than the dynamic channel resistance of FET device 42, so that the bulk terminal of P-MOS FET 25 to its drain through FET 45. Similarly, when the drain potential of FET 25 is less than its source potential, device 42 has less resistance than device 45 resulting in connection between the bulk and source of FET 25.

FIG. 4A is a schematic diagram of an implementation of the bulk switching circuit suitable for fabrication as p-well or dual-well structure. Reference numerals for like elements are used in FIGS. 4 and 4A. FETS 44 and 47 are (sources marked with arrows) connected, to the Iref output of current reference 50 and provide a predetermined (nominally 2.4 μA) bias current to diode-connected FETS 43 and 46. FETS 43 and 46 are sized (have channel width and length) to produce a forward voltage drop of $V_t$. Thus the voltages present at the drains of FETS 43 and 46 is one threshold voltage above the source and drain of the device being protected, respectively. If the potential at the source terminal of the N-MOS being protected is higher than the drain terminal, the gate-source voltage of FET 45 is larger than the gate source voltage of device 42, and the channel resistance of FET 45 is lower than that of FET 422, thereby connecting the bulk of the N-MOS device 25A being protected to its drain (the lower-potential terminal). Conversely, if the protection device's drain is higher in potential, FET 42 has a larger gate-source potential than FET 45. This reduces the channel resistance of FET 42, thereby causing the protected device bulk terminal to be connected to its source.

Referring next to FIGS. 2 and 5, consider that the driver FETS 25, 26, 27 and 28 are large devices which present large inherent capacitances to the logic circuit 31 (shown in FIG. 5) which is connected to the gate terminals of the drivers 25–28 via the level translators 30, 32, & 33 or the slew rate limited driver 39. Thus, when drivers 25–28 are switched on and off, a relatively large amount of time is needed, e.g. many microseconds, for switch over between their on and off states. If drivers 26 and 27 were turned on and off at the same time a short is produced from $V_{dd}$ to ground. Similarly, if drivers 25 and 28 were allowed to be on at once, output capacitor 16 would be discharged, reducing pump efficiency. Therefore, control logic 31 performs two main functions, namely it monitors the charging and discharging of input capacitor 15 to control the charge pump operating state, and it generates delays to insure proper sequencing of power switching drivers 25, 26, 27 and 28. There are considerable settling delays associated with amplifiers 100 and 101 shown in FIG. 9 after switching from transfer to charge mode or vice versa. Control logic 31 generates timing delays to allow these amplifiers to settle before their outputs are examined.

Control logic 31 accepts five inputs: CI—CHARGED, CO—CHARGED, ENABLE, PWR—ON, and –PASS—THROUGH (leading minus signs indicate signal inversion). The logical AND of ENABLE and PWR—ON produced by gate 76 enables the control logic circuit 31. When either ENABLE or PWR—ON is low, outputs X1 through X4 are forced to their inactive states. –PASS—THROUGH effectively by-passes the charge pump by connecting its output (Vo or Hv — FIG. 2) to $V_{dd}$ (by turning drivers 25, 26 and 28 on, and driver 27 off). Pass-through mode is enabled when the system power supply, $V_{DD}$, is above 5.25 volts as determined by voltage comparator 136 (FIG. 8). Under this condition, the charge-pump is not required to operate, as sufficient voltage is present for safe laser operation. During pass-through mode, input capacitor 15 is held charged, to provide quick pump response should $V_{dd}$ drop below 5.25 volts (indicating that charge-pump operation is required).

Control logic 31 contains standard logic NAND gates 77, 78, 79, 80, 81, 84, 89, NOR gates 87, 88, 100, S-R flop-flop 98 and several specialized logic functions that include: NAND2C gates 76, 82, 83, 85, RDELAY1 circuits 91, 92, 101, RDELAY3 circuits 93, 94, 95, 96, and FDELAY3 circuit 97. A NAND2C gate, of which item 76 is an example, is a NAND gate whose output is inverted by a digital inverter, thus producing both NAND and AND outputs. RDELAY1 and RDELAY3 circuits, when pulsed, produce a non-inverted output pulse whose leading edge is delayed by a controlled amount of time, but whose trailing edge is essentially unaffected. The FDELAY3 circuit produces a non-inverted output pulse whose trailing edge is delayed by a controlled amount of time, but whose leading edge is not delayed, when its input is pulsed.

FIG. 5A is a timing diagram for control logic 31, showing the various delays between the output signals X1, X2, X3 and X4 relative to the charge pump operating state (charge and transfer). The delays shown on the timing diagram are derived from the response times of level translating circuits 30, 32, 33 and 39 shown on FIG. 2 in conjunction with the gate capacitance of their associated MOS drivers 25, 27, 28 and 26, respectively.

S-R flip-flop 98 determines the state of the charge pump, when its Q output is low, input capacitor 15 is being charged. Conversely, when flip-flop 98 Q output is high, charge is being transferred from input capacitor 15 to output capacitor 16. S-R flip-flop 98 outputs control gates 80, 81, 88 and 89, that in turn control gates 82 through 85, whose outputs are X1, X2, X3 and X4. During charging, outputs X2 and X1 are forced active and outputs X3 and X4 are forced inactive.

Delay circuit 92 allows voltage comparator 101 (FIG. 9) sufficient time to settle before its output can cause a transition into the transfer state. Similarly, delay circuit 91 allows the CO—CHARGED signal to settle before it can cause a transition into the charge state.

Delay circuit 101 allows both voltage comparator 101 and the CO—CHARGED signal to settle when the circuit is initially enabled, preventing false transitions into the wrong state before these signals (CI—CHARGED and CO—CHARGED) are valid.

Delay circuits 93 through 97 provide the means of skewing, in time, driver control signals X1, X2, X3 and X4 to accommodate the switching delays of their associated drivers.

Figure 6:
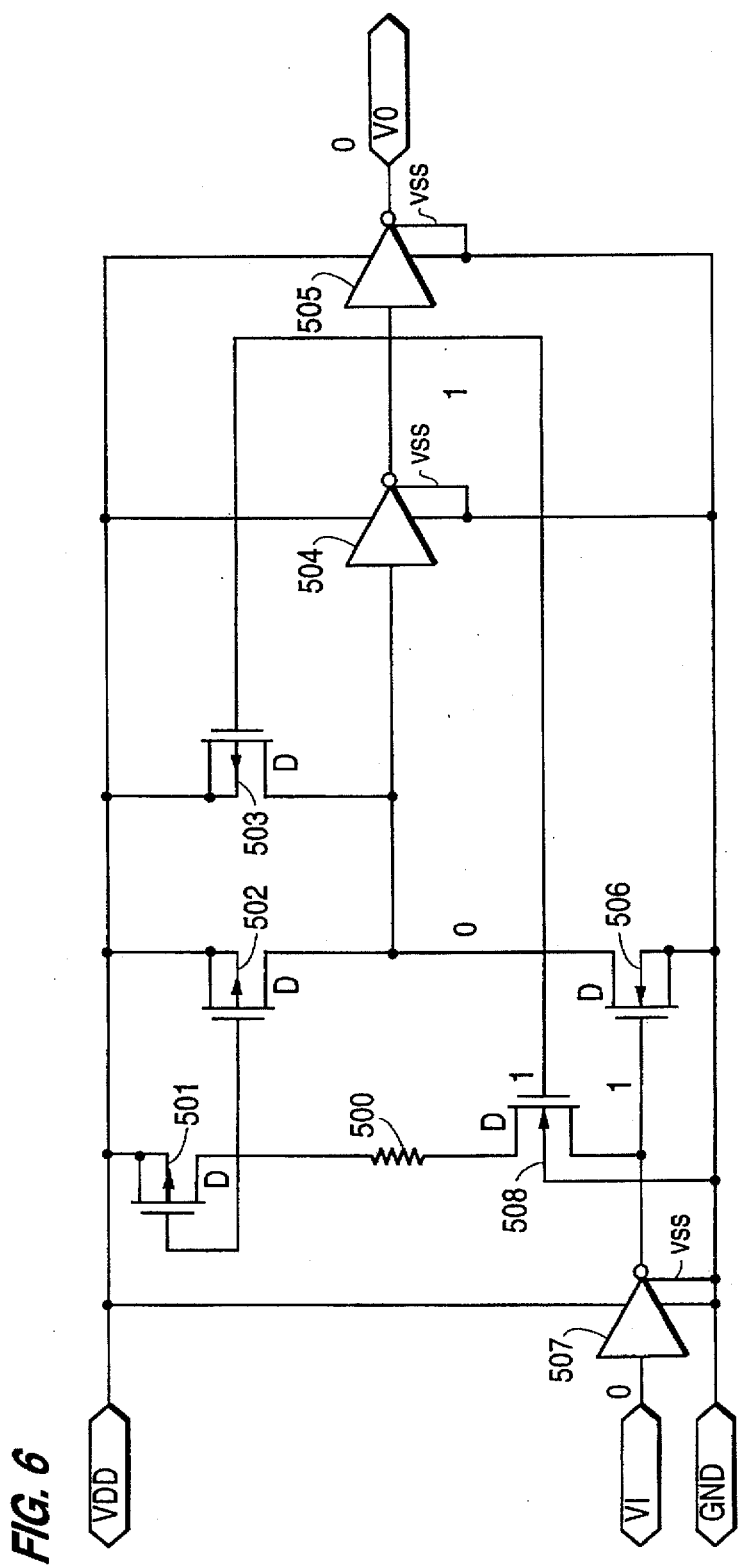
FIG. 6 is a schematic diagram showing a typical one of the delay circuits, called R Delay, 91 to 96 of FIG. 5 and which is used in the falling edge time delay circuit, called F Delay, 97 of FIG. 5 in greater detail.
Figure 10:
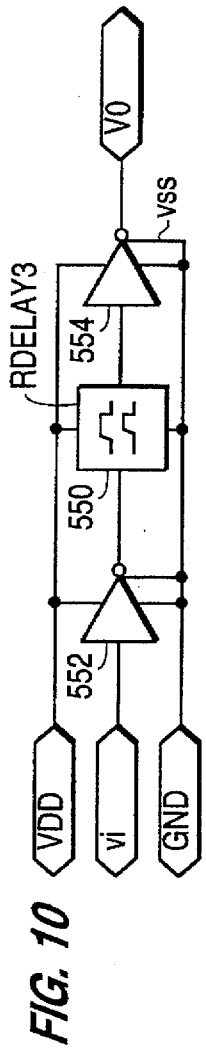
FIG. 10 is a schematic diagram showing falling-edge delay circuitry 97 of FIG. 5 in greater detail.

FIG. 6 is a schematic diagram of the RDELAY1 and RDELAY3 circuits which are used as the delay circuits 91, 92, 93, 94, 95 96, and 101. FIG. 10 is a schematic diagram of the FDELAY3 delay circuit used as delay circuit 97. As shown in FIG. 10, the FDELAY3 circuit is simply a RDELAY3 circuit 550 whose input and output are logically inverted by inverters 552 and 554.

All of these delay circuits are quite similar in design as will be apparent from the following discussion. These delay circuits exploit the nonsymmetric capacitance at the input of invertor 504, whose P-MOS FET 509 (FIG. 6A) is larger in channel width than its N-MOS FET 510. P-MOS FET 509 and N-MOS 510 have identical channel lengths, so their capacitance ratio is determined by the ratio of their channel widths commonly referred to as PC. This ratio of channel widths are selected to set the delay applied to the rising edge of the Vi input to the circuit, but has essentially no effect on the falling edge. PC may be 1.2. The circuit also employs regenerative feedback provided by P-MOS FET 503 to increase the output switching speed of the delayed rising edge.

With the Vi input initially low, invertor 507 output is high thereby turning transistor 506 on and clamping the input of invertor 504 very close to ground. Invertor 504 output is high, disabling P-MOS FET 503 and enabling N-MOS FET 508. Under these conditions N-MOS FET 508 is off, because both its source and gate terminals are logic high (Vgs=0). When Vi switches high, FET 508 turns on enabling the voltage reference formed by diode-connected P-MOS FET 501 and resistor 500. The resistance due to the dimensions of P-MOS FET 501, in conjunction with the value of resistor 500, produces a voltage drop across P-MOS FET 501 that is larger than the P-MOS threshold voltage thereof. The value of resistor 500 is varied to control the delay times obtainable by the circuit. This is the principal difference between RDELAY1 & RDELAY3. LDELAY1 has a much larger resistor 500 and is therefore able to generate longer delays.

Figure 6A:
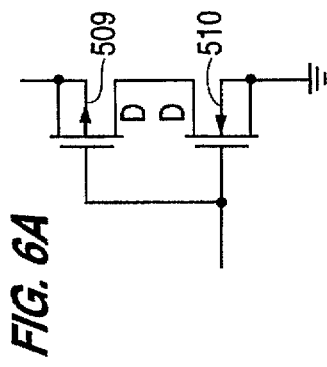
FIG. 6A is a schematic diagram showing the circuit 504 of FIG. 6 in greater detail.

The bias voltage produced across P-MOS FET 501 also appears across the source-gate junction of P-MOS FET 502, providing a bias voltage that is relatively independent of $V_{dd}$. This constant bias voltage leads to a constant drain current through P-MOS FET 502. The P-MOS FET 502 drain current charges the input capacitance of invertor 504 which is dominated by the invertor P-MOS input element 509 (FIG. 6A). As the invertor 504 input voltage increases, this voltage slowly (so as to produce the desired delay) reaches the point where its output voltage begins to drop. As the output voltage of invertor 504 drops, P-MOS FET 503 begins conduction, providing additional current to charge the input capacitance of invertor 504. This regenerative feedback causes the input voltage of invertor 504 to slowly increase to the invertor 504 threshold voltage and then abruptly charge to $V_{dd}$. Once the invertor 504 output has switched to a logic low (ground), N-MOS 508 is turned off, eliminating the current path through resistor 500 and P-MOS 501 and turning P-MOS FET 502 off. When the Vi input is later returned low, N-MOS FET 506 is turned on, quickly discharging the invertor 204 input capacitance, by virtue of its relatively high gain.

From the foregoing description of FIG. 6 and 6A, it will be apparent that the delay presented by the R and F delay circuits to a rising edge of its Vi input is controlled by the P-MOS 509 capacitance and the P-MOS 502 on-state drain current, which is in turn controlled its dimensions, resistor 500 and the dimensions of P-MOS 201. The delay presented by a falling edge of the Vi input is controlled by the gain of N-MOS 506 and the invertor 504 input capacitance.

FIG. 7 is a schematic diagram showing current reference circuit 50 of FIG. 1A in greater detail. Current reference 50 produces constant current flow in all the P-MOS devices whose sources are connected to $V_{dd}$ and whose gates are connected to the OUT terminal of the reference circuit 50. Device 151 in FIG. 7 is an example.

Current reference 50 accepts two inputs: en-L and Vref. en-L is a digital input whose level that controls the operating state of the reference 50. When en-L is active (low), the reference 50 is operating. Conversely, when en-L is inactive (high), the reference is disabled, and its current consumption is reduced to almost zero (a few nanoamperes). P-MOS FET 156, in conjunction with invertor 155 clamps the operational amplifier 52 output to the positive supply rail ($V_{dd}$) when the en-L input is high (low-power mode), insuring that all attached current mirror devices, of which FET 151 is an example, are turned-off.

Vref is a reference voltage, produced by band-gap voltage reference 55 (FIG. 1A) that, in conjunction with external resistor 153, (external to the ASIC) establishes a reference current equal to $V_{ref}/R_{153}$.

Current reference 50 employs a control loop formed by amplifier 152, P-MOS FET 154, and resistor 153 for producing a constant reference current flow through resistor 153. The control loop acts to control P-MOS FET 154 so as to maintain a constant voltage, equal to Vref, at the drain of P-MOS FET 154. In doing so, the voltage across resistor 153 is equal to Vref, thereby producing a constant current flow through the drain of P-MOS FET 154 and resistor 153 equal to the aforementioned reference current. P-MOS devices connected to the output and $V_{dd}$ shown, by example a FET 151, share the gate-source potential of device 154, so, as long as such P-MOS devices (like FET 151) are operated in their MOS saturation region, their drain currents are equal to: $V_{REF}*(M_{151}*W_{151}/L_{151})/[R_{153}*(M_{154}*W_{154}/L_{154})]$. Where M is the number of FETS constituting the device and connected in parallel and W & L are the width and length of the channel. For best performance when fabricated within an integrated circuit, devices of equal channel lengths and widths are desirable, thus reducing the equation to: $V_{ref}*M_{151}/(R_{153}*M_{54})$. More specific to the preferred embodiment the equation can be restated as $2.36 \mu A*M_{151}$. $V_{ref}$ is the voltage applied to the Vref input which is 1.183 volts in the embodiment illustrated herein, $R_{153}$ is the resistance of resistor 153 (in ohms), $M_{151}$ is the "multiplicity" of P-MOS 151, and $M_{154}$ is the multiplicity of P-MOS 154. Multiplicity refers to a number of equal sized (equal W & L) MOS devices that are connected in parallel. For example, multiplicity 5 (M=5), refers to five equal sized devices whose drain, source, gate and bulk terminals are connected, respectively.

FIG. 8 is a schematic diagram showing the voltage monitor circuit 43 of FIG. 2. Voltage monitor circuit 43 performs three main tasks associated with charge-pump operation. It senses the need to use the charge pump as indicated by the system power supply voltage (VDD in FIG. 8 which is the same as $V_{dd}$ in some of other FIGS.) being below a predetermined threshold voltage. The monitor circuit 43 also limits the charge pump output voltage to prevent potential MOS channel punch-through. The monitor circuit also can signal other circuitry, in the apparatus using the laser that the charge-pump is operating properly and is ready for use, thereby preventing operating the laser before the charge-pump output is sufficiently high enough to protect the laser.

The voltage monitor circuit 43 shown in FIG. 8 can be divided into three distinct portions, namely (a) input supply monitoring section 600 formed by resistors 139, 140, voltage comparator 136, N-MOS 138, digital invertor 137, NOR gate 135; (b) charge-pump output monitoring section 602 formed by resistors 121, 122, 123, 124, 128, 129, voltage comparators 120, 123, 130, N-MOS transistors 122, 124, 125, 127; (c) and charge-pump diagnostic circuit 604 formed by S-R flip-flop 131, D flip-flop 132, NOR gate 133 and OR gate 134. Together, and in conjunction with AND gate 40 and logic circuit 31 (FIG. 2), these circuits monitor and control the operating mode of the charge-pump to provide sufficient operating voltage to voltage regulator 19 insuring reliable laser operation.

Input supply monitoring section 600 compares via comparator 136, the system supply voltage, VDD, with VREF, after $V_{DD}$ that is scaled by the voltage divider formed by resistors 139 and 140, such that the divider's output voltage equals the band-gap reference voltage, VREF, when VDD is equal to 5.25 volts. In this manner, the voltage comparator 136 output is a logic high level when VDD is less than 5.25 volts. Conversely, when voltage comparator 136 output is low, the system power supply is equal to or above 5.25 volts. The output of comparator 136 is connected to the –PASS—THROUGH input to control logic 31 (see also in FIG. 5). Recall that the leading minus sign indicates signal inversion, so –PASS—THROUGH means NOT PASS—THROUGH. In this manner, the charge pump is operated in its pass-through mode when the system power supply is sufficiently high to afford safe laser operation. N-MOS FET 138 is operated as a digital switch that enables or disables the bias current through resistors 139 and 140 to conserve power when the charge pump is not operating, as indicated by a low-level applied to the PON input signal.

The output voltage monitoring section 602 of FIG. 8 monitors the output voltage of the charge-pump to determine if is too high, such as to be capable of MOS channel punch-through or too low for reliable laser operation. The charge-pump output voltage, Vo, is scaled by two independent voltage dividers 121, 123 & 129. The scaled Vo is compared in comparators 120, 123, and 130, with the band-gap voltage reference VREF. Voltage thresholds of 5.3 volts and 5.5 volts are established by the ratios of resistors 128, 129, and resistors 123 and 124, respectively, in conjunction with VREF. Voltage comparator 120 produces a high logic level when the charge pump output Vo is under 6.5 volts. This signal becomes is one input of AND gate 40 (FIG. 2). The other input of AND gate 40 is controlled by the ENABLE signal that enables the charge pump operation (when high). The AND gate 40 output attains a logic high when the charge pump output is under 6.5 volts and the pump should operate.

FETS 122, 125, and 127 are identical in function to FET 138. They act as switches to eliminate bias current through resistors 121, 122, 123, 125, 128 and 129 when the charge-pump is not in use.

The diagnostic circuit section 604 provides a digital output signal, named PUMP—OK, whose level indicates that the charge-pump is available to power the voltage and laser regulators 19 & (FIG. 1A). When the charge-pump is enabled (as indicated by a high logic level from invertor 41 in FIG. 1A), and operating in pass-through mode or enabled and the having an output that has exceeded 5.5 volts (since being enabled) and not dropped below 5.3 volts. S-R flip-flop 131 is set when the charge pump output falls below 5.3 volts and cleared when it exceeds 5.5 volts as directed by voltage comparators 130 and 126, respectively. S-R flip-flop 131, in conjunction with voltage comparators 126 and 130 form a digital hysteresis network that digitally filters charge pump ripple before it reaches the PUMP—OK output signal. Hysteresis is desirable because several-hundred millivolts of switching noise may typically be present at the output of the charge-pump due to continual mode switching therein (between charge and transfer modes).

D flip-flop 132 is asynchronously cleared when the charge-pump is disabled and clocked high by charge/transfer flip-flop 98 (FIG. 5, its TRN output). NOR gate 133 combines the outputs of flop-flops 131 and 132 to produce a signal whose high level indicates that the pump output is valid, when it is operating in its charge mode (e.g. as a charge-pump). NOR gate 135 combines voltage comparator 136 output with –PMPENA (PMPENA inverted by invertor 137) to produce an output that is high when the pump is on and the system power is below 5.25 volts. These two signals are combined by OR gate 134 to produce the charge-pump valid status indicator named PUMP—OK. In this manner the PUMP—OK output is a logic high level, when the pump is not needed (because $V_{DD}$ is above 5.25 volts), or after it has charged to 5.5 volts (or above 5.5 volts) and has not dropped below 5.3 volts, and at least one transfer cycle has occurred.

FIG. 9 is a schematic diagram showing charge current monitor circuit (CPCMON) 44 of FIG. 2. The charge current monitor circuit can be divided into two sections, namely (a) charge monitor section 700 formed by voltage comparator 101, resistor 110, N-MOS FET 11; and (b) transfer monitor section 702 formed by the remaining components shown in FIG. 9. Common to both of these sections 700 and 702 is N-MOS FET 103, which acts as a switch that disables the reference currents mirrored by N-MOS FETS 104, 105 and 111.

The charge monitor section 700 is responsible for monitoring the transfer of charge into input capacitor 15 and terminating charging once the voltage across the capacitor 15 reaches a fixed-voltage drop below the system supply voltage VDD. The voltage at the positive terminal C1+ of input capacitor 15 is compared in comparator 101 with a voltage that is slightly lower than VDD set by resistor 110. P-MOS FET 102 is connected to the output of current reference 50 (terminal VIREF in FIG. 9) to produce a bias current FET of approximately 2.4 µA in the illustrated circuit, which is passed through diode-connected N-MOS FET 104 and mirrored by N-MOS FET 111. The multiplicity of N-MOS 111 is chosen to amplify the reference current (for example by 10, then producing 24 µA) that passes through resistor 110 to produce the desired voltage drop of VDD (36 millivolts in this circuit). The voltage drop developed across resistor 110 insures that offset errors that may be present in voltage comparator 101 allow it to respond when capacitor 15 completely changes. The output of comparator 101 becomes the CI_CHARGED input to control logic 31.

The transfer monitor section 702 is responsible for monitoring the transfer of charge between input capacitor 15 and output capacitor 16 so that the transfer mode operation ends when the available charge in capacitor 15 has been transferred to capacitor 16. During transfer mode, drivers 27 and 28 (FIG. 2) are turned on and drivers 25 and 26 are off. Then the negative terminal of input capacitor 15 (C1) is connected to the negative terminal of output capacitor 16 and the positive terminal (C1+) of input capacitor 15 is connected to the positive terminal of output capacitor 16 through driver 28. As a result of these connections, and the fact that the voltage across input capacitor 15 is larger in than across the output capacitor 16, transfer current flows between these two capacitors and through drivers 27 and 28. The transfer current flowing through driver 27 causes a voltage drop across its channel, resulting in a potential at its drain (with respect to ground), that is below VDD by an amount proportional to the magnitude of transfer current flow. As the transfer current decreases toward zero, so does the voltage across the drain-source junction of driver 27, thus the drain voltage of driver 27 approaches VDD as the transfer current decays. By using a circuit very much like the charge monitor circuit, presented earlier, the transfer current can be monitored by comparing the driver 27 drain voltage with VDD.

N-MOS 105 amplifies the reference current produced by P-MOS 102 by ten to produce the 24 µA current flow through resistor 109, resulting in a voltage whose potential is 36 millivolts less than $V_{DD}$ at the non-inverting input of voltage comparator 100. The purpose of this small offset voltage is the same as it was for charge monitor comparator 101, namely it insures that input offset errors, that may be present in the comparator, do not defeat the voltage comparison. Comparator 100 is followed by an inverting network designed to provide additional voltage gain. The network is composed of: P-MOS 108 and N-MOS devices 106 and 107. The drain current flowing into diode-connected N-MOS 106 is mirrored by N-MOS 107 and compared with the 2.4 µA reference current produced by P-MOS 108, that is connected to current reference 50. The result of the current comparison is present at the drains of 107 and 108 in the form of a voltage. When the drain current of N-MOS 106 is less than 2.4 µA, the output voltage, COCHG, is a logic high. Conversely, when the drain current of 106 is higher than 2.4 µA COCHG is low. COCHG becomes CO—CHARGED in FIG. 2 and FIG. 5. From the foregoing discussion, it will be apparent that as charge is being transferred from input capacitor 15 to output capacitor 16, the voltage at the drain of driver 27 (relative to ground), is less than VDD by an amount proportional to the transfer current. As the transfer current approaches zero, the voltage at the drain of driver 27 approaches VDD. Voltage comparator 100 compares the voltage at the driver 27 drain with a voltage slightly less than VDD to determine when the available charge has been transferred. Once the driver 27 drain voltage is nearly equal to VDD, the COCHG output switches high indicating charge transfer is complete.

Figure 11:
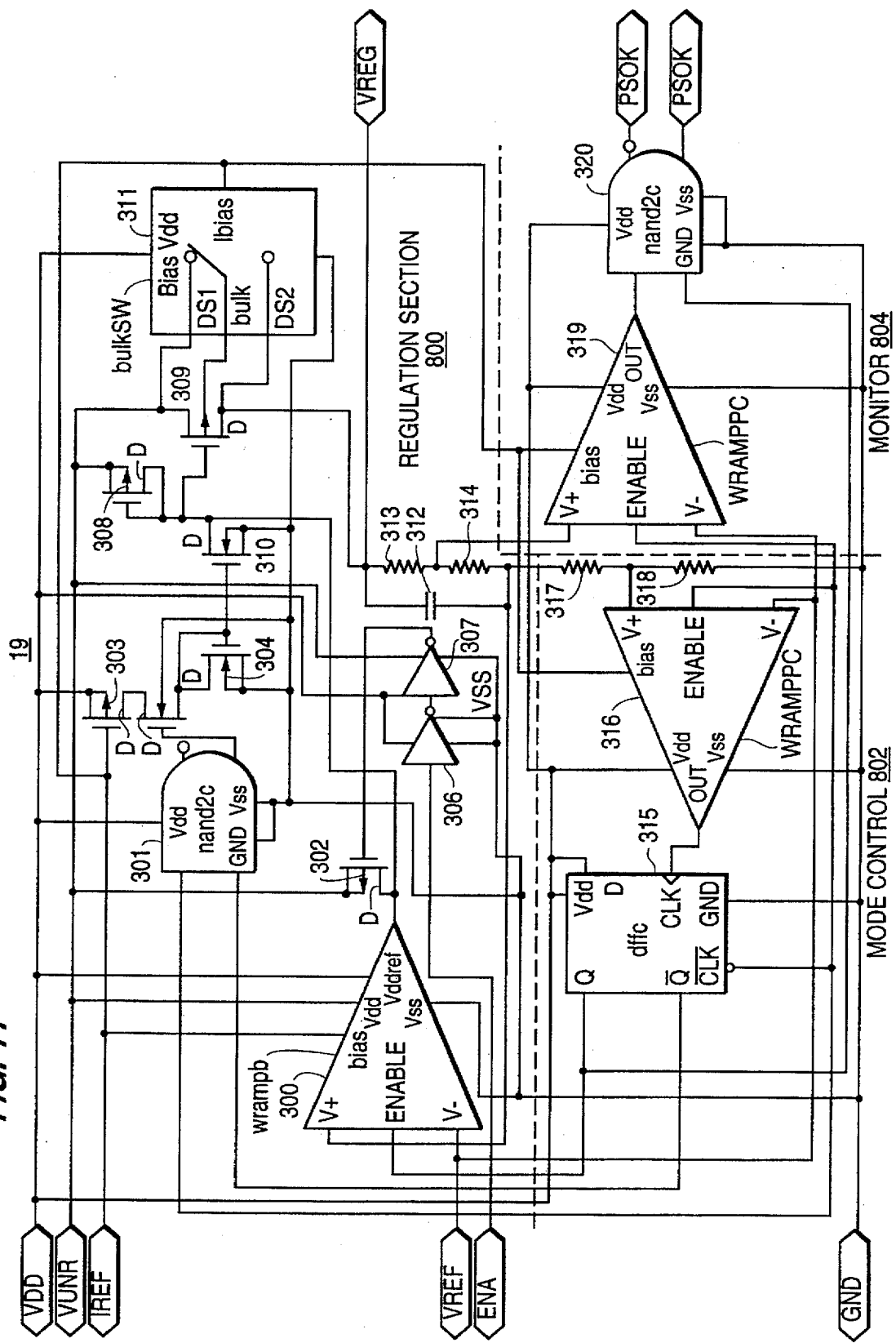
FIG. 11 is a schematic diagram showing the voltage regulator 19, of FIG. 1A, in greater detail.

FIG. 11 is a schematic diagram of a suitable circuit for voltage regulator 19 which is constructed of MOSFETs suitable for fabrication into a CMOS ASIC. The voltage regulator 19 has a linear regulation characteristic (the pass-element 309 operates in its ohmic region) that regulates the input supply VUNR (Vo from the charge pump) to provide a nominal regulation voltage, $V_{REG}$, that is produced at the regulator's output terminal VREG. VREG is the voltage regulator's output terminal, $V_{REG}$ is the regulator's nominal output voltage.

The regulator 19 responds to an ENABLE input, has surge-current limiting, to reduce current demand requirements from the load when its output capacitance (3 FIG. 1A) is initially discharged, and a power-supply condition (PSOK) output. The ENABLE (ENA) input turns the regulator off reducing its current to virtually zero to save power when the laser is not operating.

The voltage regulator can be divided into three main sections, namely (a) voltage regulation section 800 formed by components 300–314; (b) mode control or selection section 802, formed by components 315–318; and (c) monitoring circuitry 804 formed by items 319 and 320.

The mode selection section 800 uses resistors 317, 318, voltage comparator 316 and D flip-flop 315. The Q and not Q outputs of flip-flop 315 control the voltage regulator operating mode. When flip-flop 315 is clear (Q low, not Q high) and ENABLE is true (high), current-limiting mode is active. In this mode, the regulator 19, rather then regulating its output voltage, provides a constant current to charge output capacitor 3 (FIG. 1A). In this manner, the host system (battery or separate electronic power supply) that is supplying VDD is not forced to supply large surge currents normally associated with starting a linear voltage regulator. Voltage comparator 316 compares VREF (band-gap voltage reference 55 output) with the voltage developed across resistor 318, to establish the output voltage, named $V_{TRIP}$, at which the regulator switches between current limiting and voltage regulation mode. $V_{TRIP}$ can be expressed in terms of the regulator's nominal regulation voltage, VREG, by the equation: $V_{TRIP}/V_{REG}=1+R_{317}/R_{318}$. $V_{TRIP}$ is in this embodiment approximately 50 millivolts larger than VREG, insuring that offset errors, that may be present in comparator 318, do not prevent voltage regulation mode activation. If the regulator were allowed to switch from current limiting mode to voltage regulation mode before its output equaled or exceeded VREG, a large current surge would result due to operation of the voltage regulation loop.

The voltage regulation section 800 uses error amplifier 300, pass element 309, bulk switch 311, P-MOS FETS 302, 303, 308, N-MOS FETS 304, 305, 310, resistors 313, 314, capacitor 312, digital invertor 306, AND gate 301 and level translator 307.

Voltage and current regulation uses diode-connected P-MOS FET 308 and pass-element FET 309. The super-mirror arrangement of devices 308 and 309 leads to a proportional relationship between their drain currents. Thus, the voltage regulator output VREG is current limited by limiting the current flowing into P-MOS FET 308. Control signals V—MODE and I—MODE, generated by D flip-flop 315 (in the aforementioned mode selection circuit) select between two sections of circuitry. The first section, used for current limiting mode, uses of FETS 303, 304, 305, and 310. The second section, used for voltage regulation, uses of error amplifier 300, resistors 313, 314, and capacitor 312. Common to both sections are: P-MOS 308, pass-element FET 309 and bulk switch 311 (See FIG. 4).

During current limiting mode, error amplifier 300 is inhibited, and its output is pulled-up to VUNR by P-MOS FET 302. Pulling the error amplifier output to VUNR eliminates current spikes that might cause output current surges when changing from current limiting to voltage regulation mode. P-MOS FET 303, which is attached to current reference 50 (discussed in prior sections) produces a constant current that is switched on (or off) by N-MOS FET 304 in conjunction with AND gate 301. This reference current is routed through diode-connected N-MOS FET 305 and mirrored through P-MOS 308 via N-MOS 310. This current is amplified by FETS 309 and 308 to establish the desired current limit, which in the illustrated embodiment, is 5 to 10 milliamperes.

Once flip-flop 315 is clocked high, (initiating voltage regulation mode), AND gate 301 switches low, turning off the reference current produced by transistor 303. At the same time, error amplifier 300 is enabled.

Amplifier 300 is a transconductance type operational amplifier, that produces a current proportional to the difference between $V_{REF}$, and the voltage present at the junction of resistors 314 and 317. The amplifier output current is routed directly through P-MOS 309, thus forming a proportional control-loop. VREG is therefore established according to the following equation:

$$V_{REG}=V_{REF}*[1+(R_{313}+R_{314})/(R_{317}+R_{318})]$$

$V_{REF}$ is the band-gap reference voltage, nominally 1.182 volts, $R_{313}$, $R_{314}$, $R_{317}$, and $R_{318}$ are the resistances of resistors 313, 314, 317 and 318 respectively. $V_{REG}$ in the circuit illustrated herein is set to 4.76 volts. Capacitor 312 provides lead-compensation insuring adequate phase margin of the voltage regulation loop.

Consider voltage regulator monitor section 804. This section provides a digital output (and its complement) that signals circuitry in the laser scanner that the regulator is operating properly and its output is within operational limits. Voltage comparator 319 compares $V_{REF}$ with the voltage produced at the junction of resistors 313 and 314 to determine when the voltage regulator's output is at or above acceptable operating limit, $V_{OK}$. $V_{OK}$ can be expressed in terms of $V_{REG}$ as:

$$V_{REG}/V_{OK}=V_{REF}*[1+R_{314}/(R_{317}+R_{318})]$$

FIG. 12 shows a suitable pulsed laser optical power regulating circuit (1—FIG. 1A) that is capable of controlling the optical power emission of a variety of commercially available solid-state laser diodes, such as the Toshiba 9221M. The circuit accepts six digital inputs: VP, VS, –EN, RS0, RS1, RS2, three analog inputs: VC, VC90, PD, and produces three outputs: LD, VIL and LASOK.

FIG. 13 is a schematic diagram of the circuit 358 called MONCOMP4 in FIG. 12. Three N-MOS FET switching elements 400, 401 and 402 are sized (have channel dimensions and multiplicity) so as to provide minimal on-resistance in comparison to their corresponding resistors 404, 405 and 406. Thus the resistance (as observed between the Vm and Vss terminals) is essentially the sum of resistances 403, 404, 405 and 406 when their corresponding N-MOS switches are off. The resistance between Vm & Vss is programmable by RS0, RS1 and RS2 which are digital inputs controlling the resistance that converts photodiode 23 (FIG. 1A) current into a voltage that is monitored and controlled by the regulator. RS0, RS1 and RS2 are supplied by an external microprocessor (which may be part of the laser scanner) or logic to select a resistance value appropriate to the photodiode characteristics. The resistance, controlled by the values of RS0 –RS2, may, for example, be chosen so that the voltage at the PD terminal (that is attached to $V_M$ in FIG. 13), is between 0.8 and 2.5 volts when the laser is operating at its desired optical output power.

Vp is a digital signal that controls the laser pulse frequency and duty-cycle. When Vp is driven high, the laser emits coherent light, i.e. is lit. Conversely, when Vp is low, the laser is turned off. Vs is a sampling clock that is driven in-phase with Vp, and that causes the voltage at the PD terminal to be sampled and held.

Vc is an analog control voltage that establishes the desired optical output power from the laser. The regulator controls output voltage VD to produce Vc on node PD, thereby regulating the photodiode current to a value equal to PD/$R_{EQ}$ where $R_{EQ}$ is the equivalent resistance viewed between Vm and Vss of MONCOMP4 318. VC90 is 90% of VC and is typically generated by a resistive divider consisting of R/9 in series with an output resistance R (not shown). R establishes the output resistance of the divider, and is typically chosen in the 10KΩ–100KΩ range.

Lastly, the −EN input, in conjunction with the states of Vp and Vs, turn-off the regulator and place it in low-power mode. EN is low to operate the regulator and high to disable it. Vp and Vs are held low when the regulator is disabled.

The laser's photodiode current is converted to a voltage by MONCOMP4 358. This voltage is sampled by N-MOS switch 359 under control of the Vs input and held by capacitor 361. The held voltage, SVM, is compared to Vc by error amplifier 362. Amplifier 362 is of the transconductance type, producing a current proportional to the difference of SVM and Vc. The error current is routed to stabilization capacitance 363 and the gate of the regulating element 356 of the cascode pair of FETS 354 and 356, thus forming a regulating control loop that acts to maintain SVM equal to Vc.

Because the time-constant due to the gain of amplifier 362 and capacitor 363 is typically several hundred microseconds, and it may be desirable for the regulator to reach steady-state considerably sooner, a special start-up circuit, consisting of P-MOS FETS 350, and 351 and N-MOS FET 360 is incorporated. P-MOS FET 350 acts as a large-value resistor that biases P-MOS 351 in its off state unless VC is larger than the P-MOS 350 threshold voltage, $V_T$, above SVM. Under these conditions N-MOS 360 conducts, turning on P-MOS 351 quickly charging the gate of cascode driver 356. Once the held monitor voltage, SVM, reaches one threshold below VC, N-MOS 360 stops conduction turning-off P-MOS 351, ending the "start-up" cycle.

FETS 352, 353, 354 and 355 form a laser current monitoring circuit whose output voltage is proportional to laser current. N-MOS 354 mirrors the current in cascode driver 356 into diode-connected P-MOS 353. P-MOS 352 mirrors the P-MOS 353 drain current into resistor 355, producing a voltage that is proportional to laser diode 23 (FIG. 1A) current. This voltage can be periodically monitored by an A/D converter, with which the scanner is equipped to provide a diagnostic feature of the scanner.

From the foregoing description it is apparent that a new and improved laser diode operating system with protection against laser diode failure and which is suitable for implementation as an ASIC in a bulk semiconductor by CMOS fabrication techniques has been described. Variations and modifications in the herein described system and other and different implementations as with semi-conductor fabrication technology yet to be developed, will be within the scope of the invention. Thus the foregoing description should be taken as illustrative and not in a limiting sense.

What is claimed is:

1. A system for driving and controlling a laser diode, the system preventing excess current from a power source, which provides an operating voltage for the laser diode, from causing damage to the laser diode when the voltage supplied by the power source to the laser diode decreases below a certain voltage which causes the excess current, said system comprising:

means for comparing said certain voltage with a voltage corresponding to the voltage across the laser diode and for outputting a comparison signal as a result thereof; and means responsive to the comparison signal from said comparing means for regulating the voltage across the laser diode for increasing voltages across the laser diode when the voltage corresponding to the voltage across the laser diode drops below said certain voltage thereby preventing damaging the laser diode.

2. The system of claim 1, wherein said regulating means comprises means to increase the voltage across the laser diode to cause the laser diode to draw a current less than said excess current when the voltage across the laser diode is less than the voltage supplied by the supply voltage.

3. The system of claim 1, wherein said regulating means comprises a charge pump means which defines a voltage doubler for supplying said operating voltage.

4. The system of claim 3, further including enabling means operated by said comparing means for enabling said charge pump means.

5. The system of claim 4, wherein said charge pump means comprises:

means coupled to the output of said comparing means for charging a first capacitor to a voltage that equals the supply voltage; and means coupled to the output of said charging means for transferring charge from said charging means to a second capacitor for supplying increased voltage for operating said laser diode.

6. The system of claim 5, wherein said charging means includes first FET circuit means.

7. The system of claim 6, wherein said transferring means includes second FET circuit means.

8. The system of claim 4, wherein said charge pump means comprises:

a charging capacitor and one or more first drivers coupled to the output of said comparing means for charging said charging capacitor to a voltage that equals the supply voltage; and a transferring capacitor and one or more second drivers coupled to the output of said charging capacitor and said first drivers for transferring charge from said charging capacitor to said transferring capacitor when the charging voltage equals the supply voltage.

9. The system of claim 8, further including means for monitoring the charge across said charging capacitor.

10. The system of claim 9, wherein said monitoring means includes an amplifier.

11. The system of claim 8, further including means for monitoring the charge across said transferring capacitor.

12. The system of claim 11, wherein said monitoring means includes an amplifier.

13. The system of claim 1, further including:

means responsive to said operating voltage for providing a band gap voltage reference that is independent of temperature, and means for using said voltage reference to provide the voltage across said laser diode.

14. The system according to claim 8, further comprising means for varying a rate of transfer of charge from said transferring capacitor to a load including said laser diode.

15. The system according to claim 8, further comprising means for switching said charging and transferring capacitors from a charge to a transfer state.

16. The system according to claim 15, further comprising:

means for monitoring charge and discharge current to and from at least one of said charging and transferring capacitors, and means for switching to said charge state when said current being monitored indicates that said transferring capacitor has been discharged and to said transfer state when said monitored current indicates that said charging capacitor has been discharged.

17. A system for controlling an input voltage to a laser diode so that the input voltage does not drop below a predetermined value, comprising:

a comparator configured to receive the input voltage on a first port and a threshold voltage on a second port, the comparator outputting a comparison signal having one of a first and a second level based on whether the input voltage does or does not exceed the threshold voltage; and voltage increasing means coupled to the comparator and configured to increase the input voltage as an increased voltage when the comparison signal indicates that the input voltage does not exceed the threshold voltage,
wherein one of the increased voltage and the input voltage are sent to an input of the laser diode based on the result of the comparison made by the comparator, and
wherein the voltage increasing means passes the input voltage to the input of the laser diode unamplified when the comparison signal indicates that the input voltage does exceed the threshold voltage.

18. The system of claim 17, wherein the voltage increasing means comprises a charge pump.

19. The system of claim 18, further comprising a voltage regulator coupled between the charge pump and the input of the laser diode, the voltage regulator outputting a level of voltage based on a level of current received from the charge pump.

20. The system of claim 19, further comprising a laser regulator circuit configured to monitor an output of the laser diode, the laser regulator circuit including:

a monitor photodiode coupled to the laser diode and configured to produce a current proportional to an amount of irradiance output from the laser diode;

a transistor pass element which is controlled by a feedback voltage developed by the current produced by the monitor photodiode, the transistor pass element having a collector coupled to the laser diode, and an emitter coupled to a ground potential, and a base; and an operational amplifier which is coupled to the base of the transistor pass element, the operational amplifier having a first input port coupled to the monitor photodiode in order to form a feedback loop, a second input port coupled to receive a control voltage, and an output port coupled to the base of the transistor pass element to thereby close the feedback loop, wherein the control voltage is used to set the irradiance of the laser diode.

* * * * *